(12) United States Patent
Saida et al.

(10) Patent No.: US 8,787,077 B2
(45) Date of Patent: Jul. 22, 2014

(54) NONVOLATILE MEMORY DEVICE

(71) Applicant: Kabushiki Kaisha Toshiba, Tokyo (JP)

(72) Inventors: Daisuke Saida, Tokyo (JP); Naoharu Shimomura, Tokyo (JP); Minoru Amano, Kanagawa-ken (JP); Eiji Kitagawa, Kanagawa-ken (JP); Yoshishige Suzuki, Osaka-fu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/845,478

(22) Filed: Mar. 18, 2013

(65) Prior Publication Data

US 2014/0085969 A1  Mar. 27, 2014

(30) Foreign Application Priority Data

Sep. 26, 2012  (JP) ................. 2012-213275

(51) Int. Cl.
*G11C 11/02* (2006.01)
(52) U.S. Cl.
USPC .......................................... 365/158
(58) Field of Classification Search
USPC .................................. 365/158, 171
See application file for complete search history.

(56) References Cited

FOREIGN PATENT DOCUMENTS

WO   WO 2009/133650 A1   11/2009

OTHER PUBLICATIONS

Office Action issued Feb. 21, 2014, in Japanese Patent Application No. 2012-213275 with English translation.
U.S. Appl. No. 13/795,620, filed Mar. 12, 2013, Saida, et al.

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

According to one embodiment, a nonvolatile memory device includes a memory unit and a control unit. The memory unit includes a magnetic memory element which includes: a first and second ferromagnetic layers; and a first nonmagnetic layer provided between the first and the second ferromagnetic layers. The memory unit includes a magnetic field application unit configured to apply a magnetic field to the second ferromagnetic layer, the magnetic field having a component in a first in-plane direction perpendicular to a stacking direction. The control unit is electrically connected to the magnetic memory element, and is configured to implement a setting operation of changing a voltage between the first and the second ferromagnetic layers from a first set voltage to a second set voltage. The magnetic field applied by the magnetic field application unit satisfies the condition of $$\Delta H > (H_u + H_{dx}) \frac{(H_u + H_{dx} - H_{ext})}{(H_u + H_{dx} + H_{ext})}. \quad (1)$$

20 Claims, 20 Drawing Sheets

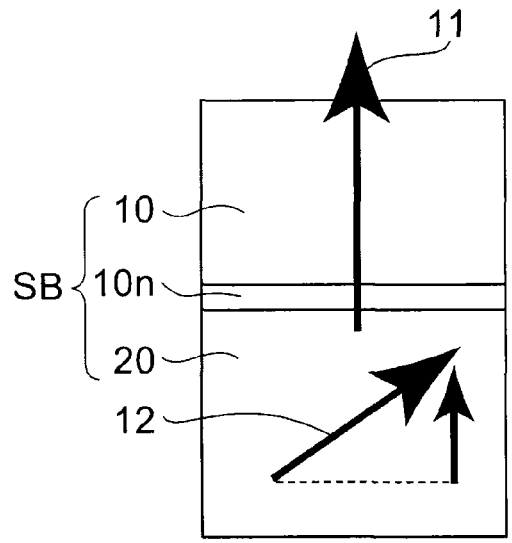
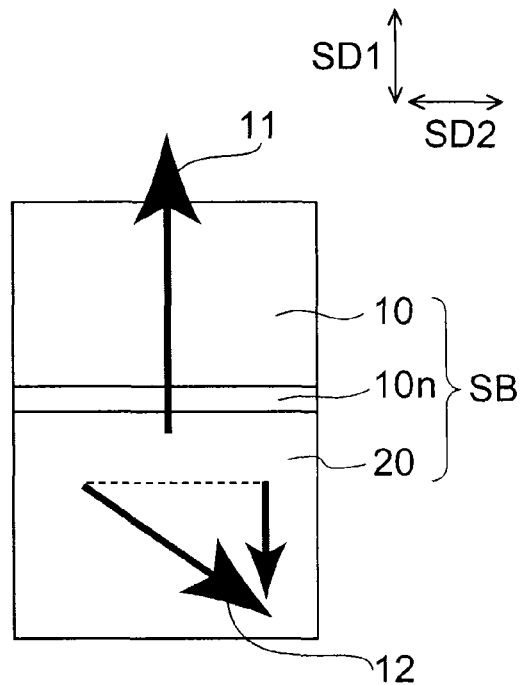
FIG. 3A          FIG. 3B
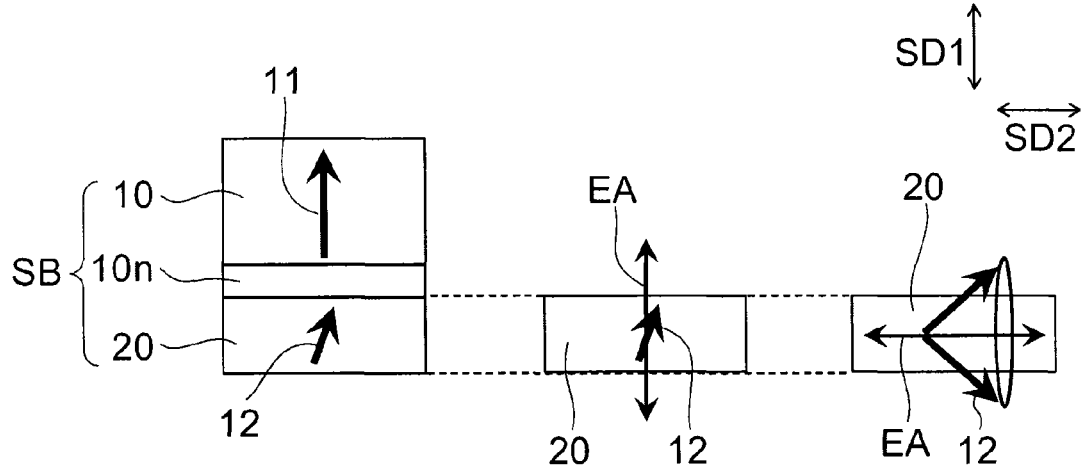
FIG. 4A          FIG. 4B          FIG. 4C

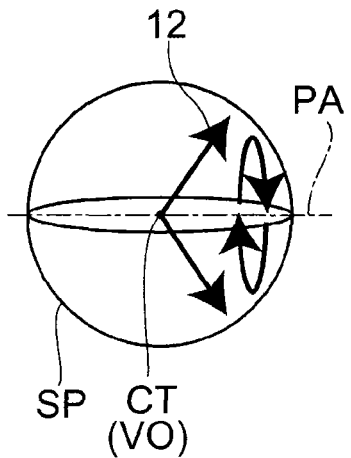 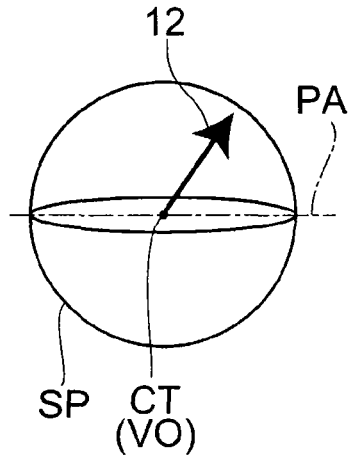 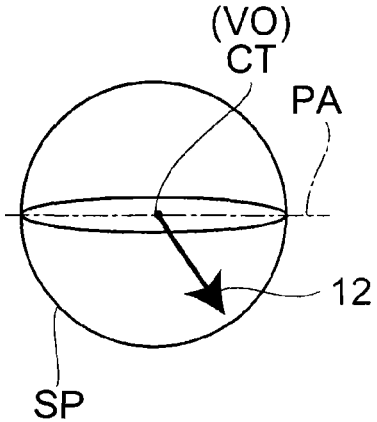
FIG. 5A    FIG. 5B    FIG. 5D
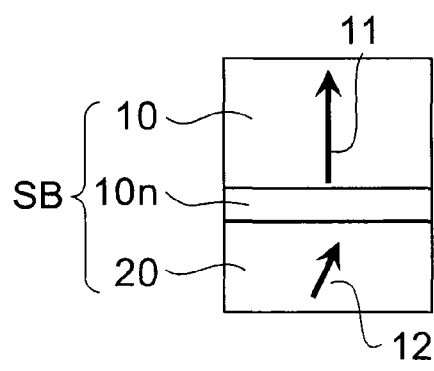 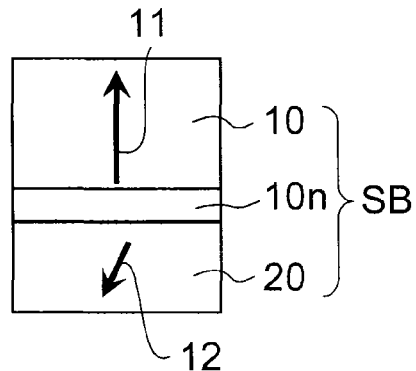
FIG. 5C    FIG. 5E

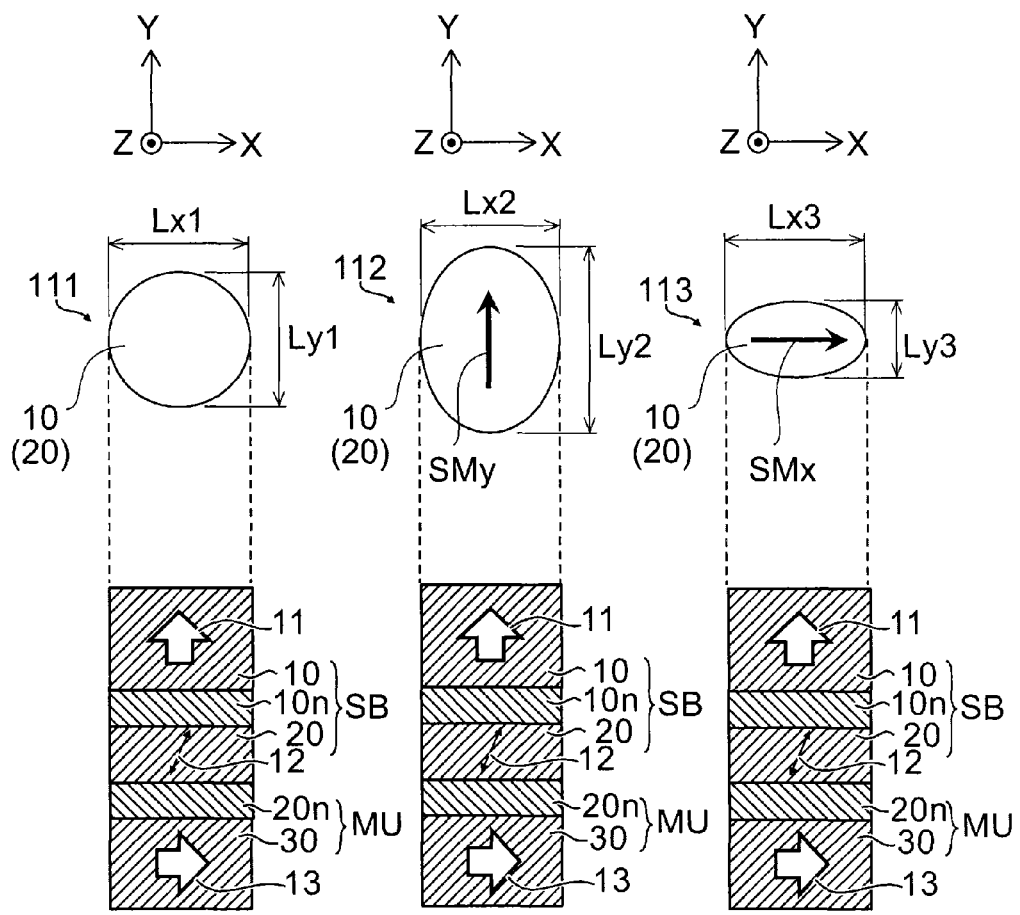

NONVOLATILE MEMORY DEVICE

CROSS-REFERENCE TO RELATED APPLICATIONS

This application is based upon and claims the benefit of priority from the prior Japanese Patent Application No. 2012-213275, filed on Sep. 26, 2012; the entire contents of which are incorporated herein by reference.

FIELD

Embodiments described herein relate generally to a nonvolatile memory device.

BACKGROUND

A configuration of magnetic random access memory (MRAM) has a data storage unit that uses a magnetic tunnel junction (MTJ) element that exhibits a tunneling magnetoresistive (TMR) effect. Such a configuration is drawing attention as a high-speed/large-capacity nonvolatile memory device. Also, there is a configuration in which the direction of the magnetization of the MTJ element is changed by applying a voltage. Stable operations are desirable for such a nonvolatile memory device.

BRIEF DESCRIPTION OF THE DRAWINGS

FIG. 3A and FIG. 3B are schematic views showing a parallel magnetization state and an antiparallel magnetization state;

FIG. 4A to FIG. 4C are schematic views showing an operation of the magnetic memory element according to the first embodiment;

FIG. 5A to FIG. 5E are schematic views showing the operation of the magnetic memory element according to the first embodiment;

FIG. 9A to FIG. 9F are schematic views showing other magnetic memory elements according to the first embodiment;

DETAILED DESCRIPTION

Figure 1:
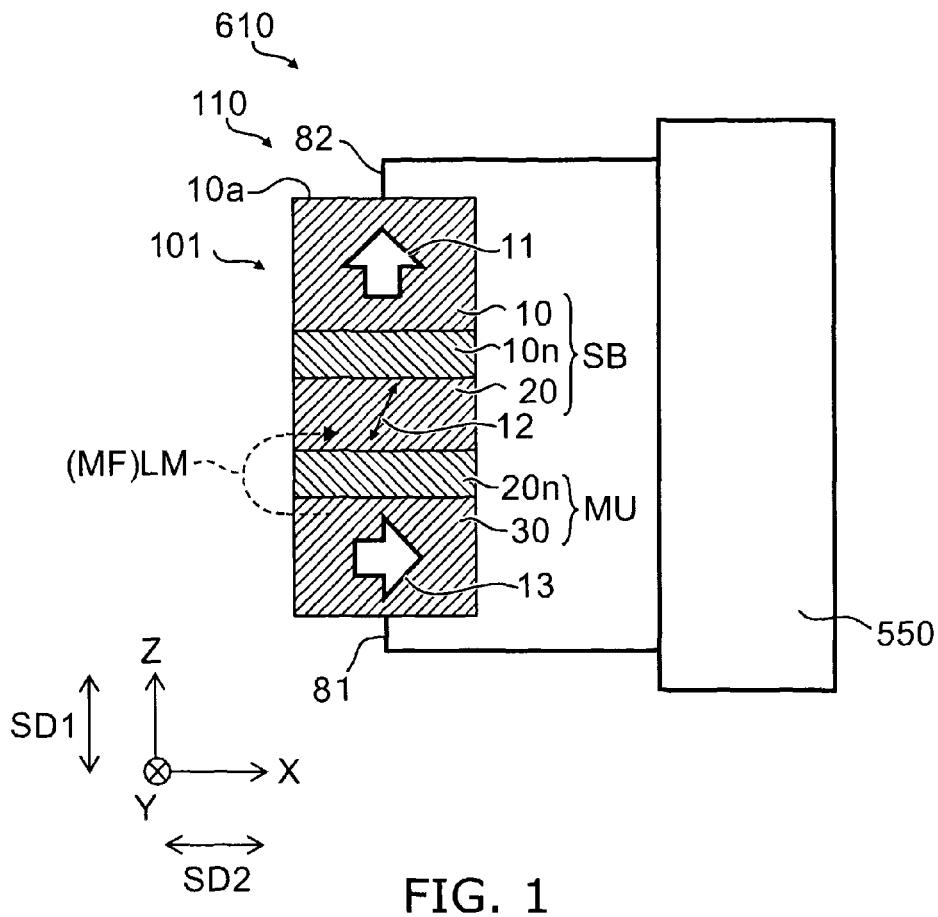
FIG. 1 is a schematic cross-sectional view showing a nonvolatile memory device according to a first embodiment.

In general, according to one embodiment, a memory device includes: a memory unit including a magnetic memory element including: a first ferromagnetic layer having a fixed direction of magnetization; a second ferromagnetic layer having a changeable direction of magnetization; and a first nonmagnetic layer provided between the first ferromagnetic layer and the second ferromagnetic layer, the magnetic memory element including a stacked body including the first ferromagnetic layer, the second ferromagnetic layer, and the first nonmagnetic layer stacked in a stacking direction, and a magnetic field application unit configured to apply a magnetic field to the second ferromagnetic layer, the magnetic field having a component in a first in-plane direction perpendicular to the stacking direction; and a control unit electrically connected to the magnetic memory element, the control unit being configured to implement a setting operation of changing a voltage between the first ferromagnetic layer and the second ferromagnetic layer of the magnetic memory element from a first set voltage to a second set voltage, the magnetic field applied by the magnetic field application unit satisfying the condition of

[Formula 1]

$$\Delta H > (H_u + H_{dx}) \frac{(H_u + H_{dx} - H_{ext})}{(H_u + H_{dx} + H_{ext})} \quad (1)$$

where a change of a stacking-direction component of an anisotropic magnetic field of the second ferromagnetic layer when changing from the first set voltage to the second set voltage is $\Delta H$ (oersteds), the stacking-direction component of the anisotropic magnetic field of the second ferromagnetic layer at the first set voltage is $H_u$ (oersteds), the first in-plane-direction component of the magnetic field applied by the magnetic field application unit is $H_{ext}$ (oersteds), and a component in the first in-plane direction of the anisotropic magnetic field of the second ferromagnetic layer at the first set voltage is $H_{dx}$ (oersteds).

Embodiments will now be described with reference to the drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic cross-sectional view showing a nonvolatile memory device according to the first embodiment.

As shown in FIG. 1, the nonvolatile memory device 610 according to the embodiment includes a memory unit 101 and a control unit 550.

The memory unit 101 includes a magnetic memory element 110 and a magnetic field application unit MU. The magnetic memory element 110 includes a stacked body SB.

The control unit 550 is electrically connected to the magnetic memory element 110. The control unit 550 controls the operation of the magnetic memory element 110 by applying a voltage and supplying a current to the magnetic memory element 110.

The stacked body SB includes a first ferromagnetic layer 10, a second ferromagnetic layer 20, and a first nonmagnetic layer 10n.

The first ferromagnetic layer 10 has a major surface 10a. The direction of a magnetization 11 of the first ferromagnetic layer 10 is substantially fixed. The direction of a magnetization 12 of the second ferromagnetic layer 20 is changeable. The first nonmagnetic layer 10n is provided between the first ferromagnetic layer 10 and the second ferromagnetic layer 20. The first ferromagnetic layer 10, the second ferromagnetic layer 20, and the first nonmagnetic layer 10n are stacked in a stacking direction SD1. The stacking direction SD1 is, for example, perpendicular to the major surface 10a.

In the specification of the application, the state of being stacked includes not only the state of being overlaid in direct contact but also the case of being overlaid with another component inserted therebetween.

A direction parallel to the stacking direction SD1 of the stacked body SB is taken as a Z-axis direction. One axis perpendicular to the Z axis is taken as an X axis. An axis perpendicular to the X axis and the Z axis is taken as a Y axis. The film surfaces of the layers included in the stacked body SB are parallel to the X-Y plane. For example, the major surface 10a is parallel to the X-Y plane.

The direction of the magnetization 11 of the first ferromagnetic layer 10 has, for example, a component perpendicular to the major surface 10a. The direction of the magnetization 11 of the first ferromagnetic layer 10 is non-parallel to the major surface 10a. The component in the stacking direction SD1 of the direction of the magnetization 11 of the first ferromagnetic layer 10 is larger than the component of the magnetization 11 of the first ferromagnetic layer 10 projected onto a plane (the X-Y plane) perpendicular to the stacking direction SD1.

The magnetization 12 of the second ferromagnetic layer 20 is changeable at least in a first direction and a second direction. When the direction of the magnetization 12 is the first direction, the component of the magnetization 12 in the stacking direction SD1 is larger than the component of the magnetization 12 projected onto the X-Y plane. When the direction of the magnetization 12 is the second direction, the component of the magnetization 12 in the stacking direction SD1 is larger than the component of the magnetization 12 projected onto the X-Y plane. The orientation of the component of the magnetization 12 in the stacking direction SD1 of the second direction is the reverse of the orientation of the component of the magnetization 12 in the stacking direction SD1 of the first direction.

For example, the orientation of the component in the stacking direction SD1 of the direction of the magnetization 11 of the first ferromagnetic layer 10 substantially does not change. The change of the direction of the magnetization 11 of the first ferromagnetic layer 10 is smaller than the change of the direction of the magnetization 12 of the second ferromagnetic layer 20. The first ferromagnetic layer 10 functions as, for example, a first fixed magnetic layer. The second ferromagnetic layer 20 performs the role of storing data. The second ferromagnetic layer 20 functions as, for example, a magnetic storage layer. In the example, the first ferromagnetic layer 10 and the second ferromagnetic layer 20 include perpendicular magnetization films.

The first nonmagnetic layer 10n functions as, for example, a first spacer layer. In the case where the first nonmagnetic layer 10n is a tunneling barrier layer based on an insulating material, the stacked body SB including the first ferromagnetic layer 10, the first nonmagnetic layer 10n, and the second ferromagnetic layer 20 has, for example, a MTJ (Magnetic Tunnel Junction) structure. The stacked body SB functions as, for example, a magnetic storage unit.

The magnetic field application unit MU applies a magnetic field MF having a component in a first in-plane direction perpendicular to the stacking direction SD1 to the second ferromagnetic layer 20. In the example, the first in-plane direction is the X-axis direction. The first in-plane direction is not limited to the X-axis direction and may be any direction perpendicular to the stacking direction SD1.

The magnetic field application unit MU includes, for example, a third ferromagnetic layer 30 and a second nonmagnetic layer 20n.

The third ferromagnetic layer 30 is stacked with the stacked body SB in the stacking direction SD1. The direction of a magnetization 13 of the third ferromagnetic layer 30 is substantially fixed. The component of the magnetization 13 of the third ferromagnetic layer 30 projected onto the X-Y plane is larger than the component in the stacking direction SD1 of the direction of the magnetization 13 of the third ferromagnetic layer 30. In the example, the X-axis direction component of the magnetization 13 of the third ferromagnetic layer 30 is larger than the Y-axis direction component of the magnetization 13 of the third ferromagnetic layer 30 and the component in the stacking direction SD1 of the direction of the magnetization 13 of the third ferromagnetic layer 30.

The second nonmagnetic layer 20n is provided between the third ferromagnetic layer 30 and the stacked body SB. In the example, the third ferromagnetic layer 30, the second nonmagnetic layer 20n, the second ferromagnetic layer 20, the first nonmagnetic layer 10n, and the first ferromagnetic layer 10 are stacked in this order. Thereby, the magnetic field application unit MU applies a leakage magnetic field LM having an X-axis direction component to the second ferromagnetic layer 20.

The third ferromagnetic layer 30 functions as, for example, a second fixed magnetic layer. In the example, the third ferromagnetic layer 30 includes an in-plane magnetization film. The second nonmagnetic layer 20n functions as, for example, a second spacer layer. The second nonmagnetic layer 20n may be provided if necessary and may be omitted.

The memory unit 101 further includes a first conductive layer 81 and a second conductive layer 82. The first conductive layer 81 and the second conductive layer 82 may be included in the magnetic memory element 110. The stacked body SB is disposed between the first conductive layer 81 and the second conductive layer 82. The magnetic field application unit MU is disposed between the stacked body SB and the first conductive layer 81. The first conductive layer 81 is electrically connected to the magnetic field application unit MU. In the example, the first conductive layer 81 is electrically connected to the third ferromagnetic layer 30. The second conductive layer 82 is electrically connected to the stacked body SB. In the example, the second conductive layer 82 is electrically connected to the first ferromagnetic layer 10.

The first conductive layer 81 and the second conductive layer 82 are electrically connected to the control unit 550. The magnetic memory element 110 is connected directly or indirectly to the control unit 550 via the first conductive layer 81 and the second conductive layer 82. The first conductive layer 81 and the second conductive layer 82 may be considered to be separate from the magnetic memory element 110.

The control unit 550 applies the voltage and supplies the current to the magnetic memory element 110 via the first conductive layer 81 and the second conductive layer 82. The control unit 550 implements a setting operation of changing, for example, the voltage between the first ferromagnetic layer 10 and the second ferromagnetic layer 20 of the magnetic memory element 110 from the first set voltage to the second set voltage. The first set voltage is, for example, the voltage (the initial voltage) in the state directly prior to applying the second set voltage. The first set voltage may be substantially the same voltage as the ground potential or may be a voltage having a prescribed potential difference from the ground potential. Or, the first set voltage may be a floating potential. In other words, the first set voltage may be the voltage between the first ferromagnetic layer 10 and the second ferromagnetic layer 20 in the state in which a voltage is deliberately not applied between the first ferromagnetic layer 10 and the second ferromagnetic layer 20. In the case where the first set voltage has a prescribed potential difference from the ground potential, the control unit 550 applies, for example, the second set voltage after applying the first set voltage between the first ferromagnetic layer 10 and the second ferromagnetic layer 20. In the description hereinbelow, the first set voltage is a floating potential.

The magnetic field MF applied by the magnetic field application unit MU satisfies the condition of Formula (1). In the example, the leakage magnetic field LM satisfies the condition of Formula (1).

[Formula 1]

$$\Delta H > (H_u + H_{dx}) \frac{(H_u + H_{dx} - H_{ext})}{(H_u + H_{dx} + H_{ext})} \quad (1)$$

A change $\Delta H$ (Oe (oersteds)) of the component in the stacking direction SD1 of the anisotropic magnetic field of the second ferromagnetic layer 20 when the first set voltage is changed to the second set voltage, a component $H_u$ (Oe) in the stacking direction SD1 of the anisotropic magnetic field of the second ferromagnetic layer 20 at the first set voltage, a component $H_{ext}$ (Oe) in the first in-plane direction (the X-axis direction) of the magnetic field MF applied by the magnetic field application unit MU, and a component $H_{dx}$ (Oe) in the X-axis direction of the anisotropic magnetic field of the second ferromagnetic layer 20 at the first set voltage are used in Formula (1). In particular, $\Delta H$ is the difference between values of the component in the stacking direction SD1 of the anisotropic magnetic field of the second ferromagnetic layer 20 for different set voltages between the first ferromagnetic layer 10 and the second ferromagnetic layer 20.

The component $H_{dx}$ in the X-axis direction of the anisotropic magnetic field of the second ferromagnetic layer 20 is, for example, a shape anisotropy field of the second ferromagnetic layer 20. The second in-plane direction is a direction perpendicular to the stacking direction SD1 and the first in-plane direction. For example, in the case where the length of the second ferromagnetic layer 20 in the first in-plane direction is longer than the length of the second ferromagnetic layer 20 in the second in-plane direction, the second ferromagnetic layer 20 has a shape anisotropy field that has a first in-plane-direction component. Thus, the component $H_{dx}$ in the first in-plane direction of the anisotropic magnetic field of the second ferromagnetic layer 20 is, for example, a shape anisotropy field acting on the magnetization 12 of the second ferromagnetic layer 20.

$\Delta H$ can be determined by, for example, measuring the change of the resonance frequency when changing from the first set voltage to the second set voltage. The change of the resonance frequency can be measured by, for example, spectral analysis using a spectrum analyzer. The change of the resonance frequency also can be determined by, for example, observing the voltage dependence of the hysteresis response of the magnetic field of the magnetization.

$\Delta H$ also can be determined by, for example, measuring the change between the magnetoresistance in the state in which the first set voltage is applied (e.g., the state in which a voltage is not applied) and the magnetoresistance in the state in which the second set voltage is applied.

$H_u$ can be measured by, for example, a thermally excited FMR method (MagNoise measurement), which is a measurement method that can estimate $H_u$ from thermal fluctuation. $H_u$ also can be determined by, for example, observing the voltage dependence of the hysteresis response of the magnetic field of the magnetization.

$H_{ext}$ can be estimated, for example, from the formula described in Paper (1) recited below using parameters of the pinned layers.

$H_{dx}$ can be estimated, for example, from a demagnetizing factor Nd that comes from a saturation magnetization Ms and the configuration of the second ferromagnetic layer 20. Nd can be estimated using the formula according to Paper (2) recited below.

The maximum value of $H_{dx}$ is $4\pi NdMs$.

Paper (1): R. Engel-Herbert and T. Hesjedal, Journal of Applied Physics 97, 074504 (2005)

Paper (2): A. Aharoni, Journal of Applied Physics 83, 3432 (1998)

Figure 2A:
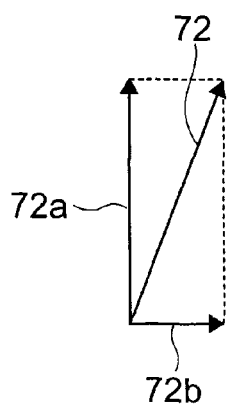
FIG. 2A and FIG. 2B are schematic views showing a magnetization.
Figure 2B:
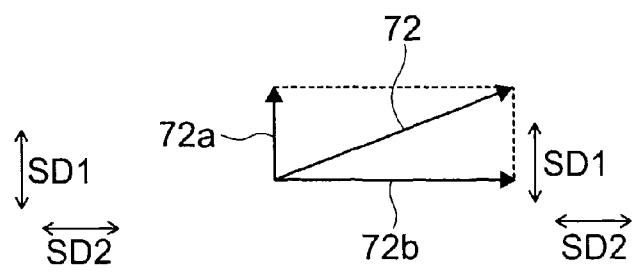

FIG. 2A and FIG. 2B are schematic views showing the magnetization.

FIG. 2A shows the magnetization of a perpendicular magnetization film. FIG. 2B shows the magnetization of an in-plane magnetization film.

As shown in FIG. 2A and FIG. 2B, one direction perpendicular to the stacking direction SD1 is taken as an in-plane direction SD2. The in-plane direction SD2 is a direction in the X-Y plane. An in-plane magnetization component 72b of a magnetization 72 is the component of the magnetization 72 projected onto the X-Y plane. The in-plane magnetization component 72b is parallel to the in-plane direction SD2. A perpendicular magnetization component 72a of the magnetization 72 is the component of the magnetization 72 projected onto the Z-axis direction. The perpendicular magnetization component 72a is parallel to the stacking direction SD1.

As shown in FIG. 2A, the perpendicular magnetization component 72a of the perpendicular magnetization film has a magnetization state that is larger than that of the in-plane magnetization component 72b. Regarding the operating characteristics, it is desirable for the direction of the magnetization of the perpendicular magnetization film to be substantially perpendicular to the film surface.

As shown in FIG. 2B, the in-plane magnetization component 72b of the in-plane magnetization film has a magnetization state that is larger than that of the perpendicular magnetization component 72a. Regarding the operating characteristics, it is desirable for the direction of the magnetization of the in-plane magnetization film to be substantially parallel to the film surface.

For convenience of description, the direction from the second ferromagnetic layer 20 toward the first ferromagnetic layer 10 is called "up" or "upward." The direction from the first ferromagnetic layer 10 toward the second ferromagnetic layer 20 is called "down" or "downward."

As described above, the direction of the magnetization 11 of the first ferromagnetic layer 10 is substantially fixed. As shown in FIG. 1, the direction of the magnetization 11 of the first ferromagnetic layer 10 of the magnetic memory element 110 is upward. However, various modifications of the direction of the magnetization 11 of the first ferromagnetic layer 10 are possible. For example, the direction of the magnetization 11 of the first ferromagnetic layer 10 may be downward.

For example, the voltage may be applied to the stacked body SB and the magnetic field application unit MU via the first conductive layer 81 and the second conductive layer 82. The direction of the magnetization 12 of the second ferromagnetic layer 20 may be controlled by applying the voltage to the stacked body SB and the magnetic field application unit MU. For example, "0" or "1" is allotted according to the direction of the magnetization 12 of the second ferromagnetic layer 20. Thereby, the information of "0" or "1" is stored in the magnetic memory element 110.

In the example, for example, the orientation of the component of the magnetization 12 in the stacking direction SD1 of the second ferromagnetic layer 20 oriented in the first direction is upward; and the orientation of the component of the magnetization 12 in the stacking direction SD1 of the second ferromagnetic layer 20 oriented in the second direction is downward. The orientations of the component of the magnetization 12 in the stacking direction SD1 in the first direction and the second direction may be opposite to those recited above.

FIG. 3A and FIG. 3B are schematic views showing a parallel magnetization state and an antiparallel magnetization state.

FIG. 3A shows the parallel magnetization state. FIG. 3B shows the antiparallel magnetization state.

In the parallel magnetization state as shown in FIG. 3A, the orientation of the component in the stacking direction SD1 of the direction of the magnetization 11 of the first ferromagnetic layer 10 is the same as the orientation of the component in the stacking direction SD1 of the direction of the magnetization 12 of the second ferromagnetic layer 20.

In the antiparallel magnetization state as shown in FIG. 3B, the orientation of the component in the stacking direction SD1 of the direction of the magnetization 11 of the first ferromagnetic layer 10 is the reverse of the orientation of the component in the stacking direction SD1 of the direction of the magnetization 12 of the second ferromagnetic layer 20.

For example, the parallel magnetization state is allotted to "0" of the information; and the antiparallel magnetization state is allotted to "1" of the information. In other words, in the example, the state in which the magnetization 12 of the second ferromagnetic layer 20 is oriented in the first direction is "0;" and the state in which the magnetization 12 of the second ferromagnetic layer 20 is oriented in the second direction is "1." The relationship between the information of "0" and "1" and the direction of the magnetization 12 may be opposite to that recited above. The changeable directions of the magnetization 12 of the second ferromagnetic layer 20 may be three or more. Thereby, for example, a multi-bit magnetic memory element 110 can be realized.

Examples of configurations and operations of the magnetic memory element 110 will now be described. The following description is applicable not only to the magnetic memory element 110 but also to other magnetic memory elements according to the embodiment described below.

First, the operation of programming the information will be described.

FIG. 4A to FIG. 4C are schematic views showing the operation of the magnetic memory element according to the first embodiment.

FIG. 4A to FIG. 4C show a method for changing the direction of the magnetization 12 of the second ferromagnetic layer 20 according to the application of a voltage. To simplify the description, only the stacked body SB is shown in FIG. 4A to FIG. 4C. FIG. 4A shows the stacked body SB prior to the application of the voltage (when the voltage is not applied). FIG. 4B shows the second ferromagnetic layer 20 prior to the application of the voltage. FIG. 4C shows the second ferromagnetic layer 20 when applying the voltage. In FIG. 4A and FIG. 4B, the orientation of the component in the stacking direction SD1 of the direction of the magnetization 12 of the second ferromagnetic layer 20 is upward.

In the state prior to the application of the voltage as shown in FIG. 4A and FIG. 4B, the component of the magnetization 12 of the second ferromagnetic layer 20 projected onto the stacking direction SD1 is larger than the component of the magnetization 12 of the second ferromagnetic layer 20 projected onto the in-plane direction SD2. When a voltage having a short rising time (a pulse voltage) is applied to the magnetic memory element 110, the anisotropic magnetic field of the magnetization 12 in the direction in the stacking direction SD1 becomes smaller than the effective magnetic field of the magnetization 12 in the direction along the in-plane direction SD2. As a result, an easy magnetization axis EA of the second ferromagnetic layer 20 tilts toward the in-plane direction SD2 side not less than 45 degrees from the stacking direction SD1; and the magnetization 12 precesses with the easy magnetization axis EA as an axis. As a result, in the precession, the component of the magnetization 12 projected onto the stacking direction SD1 repeats the upward state and the downward state.

FIG. 5A to FIG. 5E are schematic views showing the operation of the magnetic memory element according to the first embodiment.

FIG. 5A to FIG. 5E show a method for determining the magnetization direction of the second ferromagnetic layer 20. To simplify the description, only the stacked body SB is shown in FIG. 5A to FIG. 5E. In the precession in FIG. 5A, FIG. 5B, and FIG. 5D, the motion of the magnetization 12 of the second ferromagnetic layer 20 is considered to be inside a sphere SP. The sphere SP is, for example, a virtual sphere having a center CT disposed on an axis PA of the precession of the magnetization 12.

In the precession as shown in FIG. 5A, the state in which the magnetization 12 of the second ferromagnetic layer 20 is in the upper hemisphere of the sphere SP and the state in which the magnetization 12 of the second ferromagnetic layer 20 is in the lower hemisphere of the sphere SP are repeated. Here, the upper hemisphere is the portion of the sphere SP on the upper side of the plane parallel to the X-Y plane that includes the center CT. The lower hemisphere is the portion of the sphere SP on the lower side of the plane parallel to the X-Y plane that includes the center CT. In the example, the axis PA is a line in the plane parallel to the X-Y plane that includes the center CT. In the example, an origin VO of the magnetization vector of the magnetization 12 is taken to be the center CT. In other words, in the precession, the magnetization 12 crosses the plane parallel to the X-Y plane that includes the center CT.

To make the parallel magnetization state as shown in FIG. 5B and FIG. 5C, the voltage is switched OFF in the state in which the magnetization 12 is in the upper hemisphere. When the voltage is switched OFF, the effect of the component in the stacking direction SD1 of the magnetic field becomes strong; and the magnetization 12 relaxes upward. As a result, the magnetization 12 of the second ferromagnetic layer 20 and the upward magnetization 11 of the first ferromagnetic layer 10 are in the parallel magnetization state.

To make the antiparallel magnetization state as shown in FIG. 5D and FIG. 5E, the voltage is switched OFF in the state in which the magnetization 12 is in the lower hemisphere. In such a case, the magnetization 12 of the second ferromagnetic layer 20 relaxes downward. Thereby, the magnetization 11 and the magnetization 12 are in the antiparallel magnetization state.

FIG. 6A to FIG. 6D are graphs showing the operation of the nonvolatile memory device according to the first embodiment.

FIG. 6A to FIG. 6D show a more detailed description of the method for controlling the magnetization by the voltage.

Figure 6A:
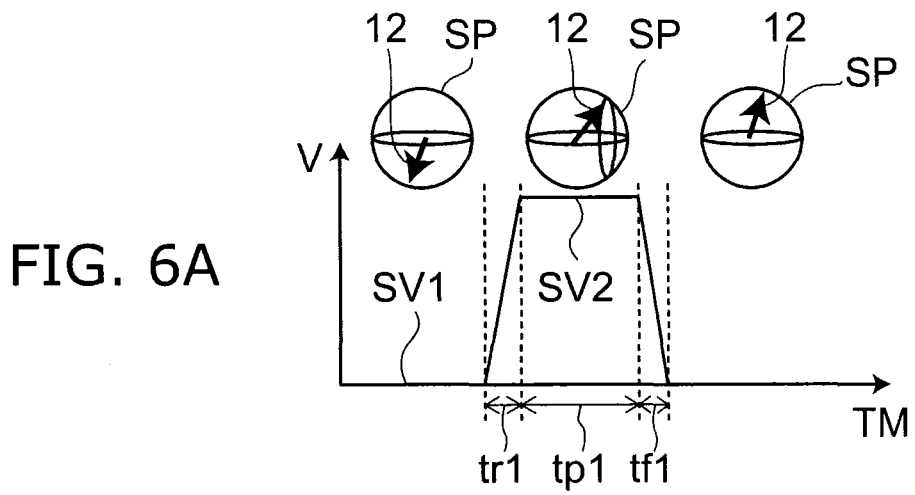
FIG. 6A to FIG. 6D are graphs showing an operation of a nonvolatile memory device according to the first embodiment.
Figure 6B:
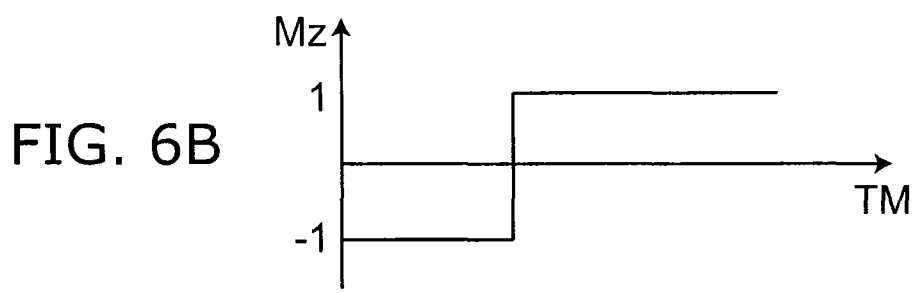
Figure 6C:
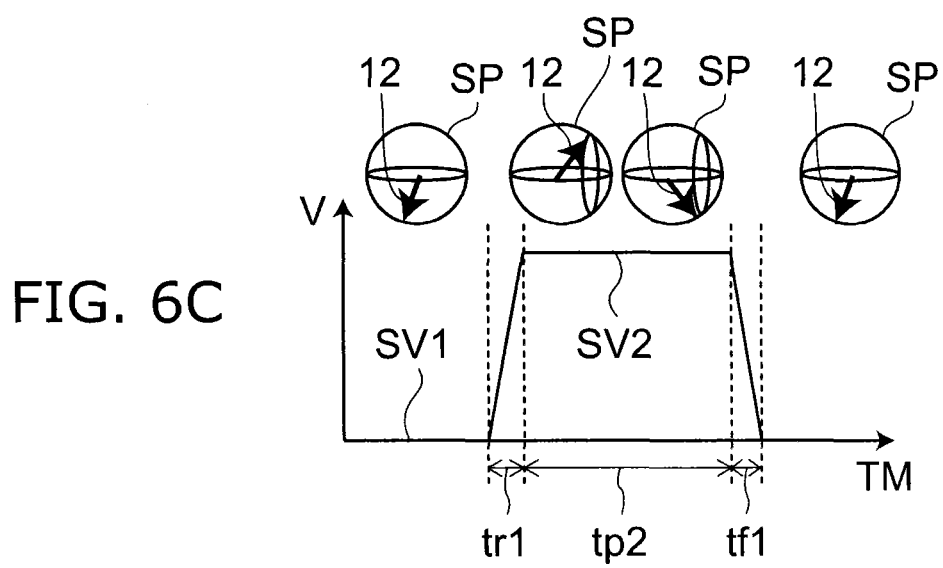
Figure 6D:
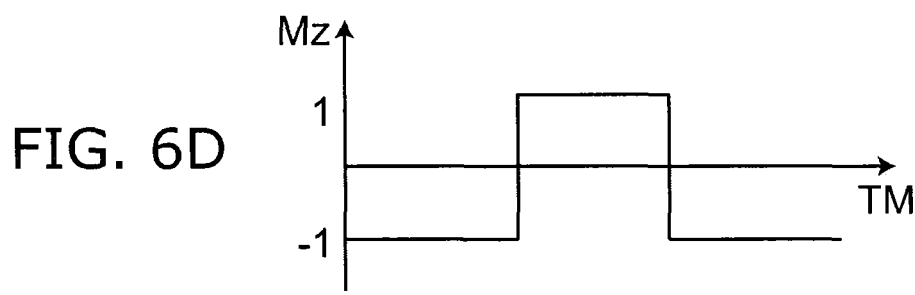

In FIG. 6A to FIG. 6D, the horizontal axis is a time TM. In FIG. 6A and FIG. 6C, the vertical axis is the value of the voltage that is applied. In FIG. 6B and FIG. 6D, the vertical axis is a normalized value Mz that is normalized such that the state in which the component in the stacking direction SD1 of the direction of the magnetization 12 is upward is "1" and the state in which the component in the stacking direction SD1 of the direction of the magnetization 12 is downward is "−1." Focusing on the magnetization 12 of the second ferromagnetic layer 20, the magnetization state is illustrated as the sphere SP in FIG. 6A and FIG. 6C.

As shown in FIG. 6A and FIG. 6B, for example, in the case where the initial state is the state in which the magnetization 12 is downward, the voltage is changed from a first set voltage SV1 to a second set voltage SV2. The second set voltage SV2 is, for example, a pulse voltage. The second set voltage SV2 has a first rising time tr1, a first duration tp1, and a first trailing time tf1. The first rising time tr1 is, for example, the time of the change between the first set voltage SV1 and the second set voltage SV2. The first duration tp1 is, for example, the time between the end point of the first rising time tr1 and the start point of the first trailing time tf1. In the first duration tp1, the value of the second set voltage SV2 may be substantially constant or may change.

In the case where the first rising time tr1 is shorter than 1 ns (e.g., less than 1 nanosecond and not less than 10 picoseconds), the magnetization projection component of the second ferromagnetic layer 20 in the in-plane direction SD2 becomes larger than the magnetization projection component of the second ferromagnetic layer 20 in the stacking direction SD1. In the precession of the magnetization 12, the magnetization 12 relaxes upward in the case where the second set voltage SV2 is switched OFF (the voltage is changed back to the first set voltage SV1 from the second set voltage SV2) when the magnetization 12 is in the upper hemisphere. In other words, Mz=1. A period Cp (seconds) of the precession of the magnetization 12 is determined by, for example, the magnitude of the effective magnetic field in the easy magnetization axis direction.

The first duration tp1 (seconds) is, for example, not less than 0.75 times (Cp/2)×(2n−1) and not more than 1.25 times (Cp/2)×(2n−1) (n being an integer not less than 1).

Thereby, the start state of Mz=−1 can be switched to the end state of Mz=1.

The first rising time tr1 is set to be shorter than a relaxation time $\tau_{relax}$ of the change of the direction of the magnetization 12 of the second ferromagnetic layer 20. Thereby, the modulation of the magnetic anisotropy of the second ferromagnetic layer 20 can be caused to act more effectively. In other words, the second set voltage SV2 for which tr1<$\tau_{relax}$ is applied. Thereby, the magnetization 12 of the second ferromagnetic layer 20 precesses around an axis that is in a direction that is different from the first direction and the second direction. For example, $\tau_{relax}$ can be determined using Formula (2).

[Formula 2]

$$\tau_{relax} = \frac{1}{\alpha \gamma H_{eff}} \quad (2)$$

The Gilbert damping constant α of the second ferromagnetic layer 20, a gyromagnetic constant γ (Hz/Oe (hertz/oersteds) of the second ferromagnetic layer 20, and an effective magnetic field $H_{eff}$ (Oe) of the second ferromagnetic layer 20 in the easy magnetization axis direction are used in Formula (2).

The effective magnetic field $H_{eff}$ can be determined, for example, using Formula (3).

[Formula 3]

$$H_{eff} = H_u + H_{demag} + H_{ext} \quad (3)$$

The magneto-crystalline anisotropy $H_u$ of the stacking direction SD1, the demagnetizing field $H_{demag}$ (Oe), and the external magnetic field $H_{ext}$ (Oe) are used in Formula (3).

In the case where the initial state is the state in which the magnetization 12 is downward, the method for making the antiparallel magnetization state is as follows. In such a case, the voltage may not be changed from the first set voltage SV1 to the second set voltage SV2 because it is unnecessary to change the magnetization direction.

In the case where the first set voltage SV1 is changed to the second set voltage SV2 as shown in FIG. 6C and FIG. 6D, the second set voltage SV2 has the first rising time tr1, a second duration tp2, and the first trailing time tf1. The second duration tp2 is selected such that the second set voltage SV2 is switched OFF when the magnetization 12 is in the lower hemisphere. Thereby, the magnetization 12 relaxes downward. In other words, Mz=−1.

The second duration tp2 (seconds) is, for example, not less than 0.75 times (Cp/2)×2(n) and not more than 1.25 times (Cp/2)×2(n) (n being an integer not less than 1).

Thereby, the start state of Mz=−1 can be switched to the end state of Mz=−1.

A current flows from the first ferromagnetic layer 10 to the second ferromagnetic layer 20 when a voltage is applied to the first ferromagnetic layer 10 (the reference layer), the first nonmagnetic layer 10n, and the second ferromagnetic layer 20 (the storage layer). At this time, the electrons passing through the first ferromagnetic layer 10 have spins in the same direction as the magnetization 11 of the first ferromagnetic layer 10. When the electrons flow into the second ferromagnetic layer 20, the angular momentum of the spins is transferred to the second ferromagnetic layer 20 and acts on the magnetization 12 of the second ferromagnetic layer 20. In other words, a so-called spin-transfer torque acts. The change of the magnetization direction of the second ferromagnetic layer 20 does not utilize the spin-transfer torque. Herein, the modulation of the magnetic anisotropy occurring in the voltage application is utilized. This can be confirmed because the coercive force (Hc) and/or the resonance frequency of the magnetic memory element 110 change in the voltage application. The polarity of the second set voltage SV2 applied to change the direction of the magnetization 12 of the second ferromagnetic layer 20 according to the embodiment may be in one direction.

As described above, the application of the second set voltage SV2 is implemented by the control unit 550. In other words, the programming or the erasing of the information to or from the magnetic memory element 110 is implemented by the control unit 550. The setting operation is, for example, an operation of changing the direction of the magnetization 12 of the second ferromagnetic layer 20 from the first direction to the second direction or from the second direction to the first direction by changing the first set voltage SV1 to the second set voltage SV2. For example, the control unit 550 changes the magnetization 12 to the second direction by changing the first set voltage SV1 to the second set voltage SV2 in the state in which the magnetization 12 is oriented toward the first direction; and the control unit 550 changes the magnetization 12 to the first direction by changing the first set voltage SV1 to the second set voltage SV2 in the state in which the magnetization 12 is oriented toward the second direction.

An example of a read-out operation will now be described.

The sensing of the direction of the magnetization 12 of the second ferromagnetic layer 20 of the magnetic memory element 110 is implemented by, for example, utilizing the magnetoresistance effect. In the magnetoresistance effect, the electrical resistance changes due to the relative orientations of the magnetizations of each layer. In the case where the magnetoresistance effect is utilized, a sense current is caused to flow between the first ferromagnetic layer 10 and the second ferromagnetic layer 20; and the magnetoresistance is measured. The value of the sense current is set to be, for example, such that the orientation of the magnetization 12 of the second ferromagnetic layer 20 is not changed by the spin-transfer torque.

Figure 7A:
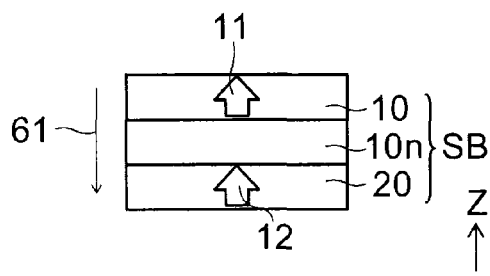
FIG. 7A and FIG. 7B are schematic views showing the operation of the nonvolatile memory device according to the first embodiment.
Figure 7B:
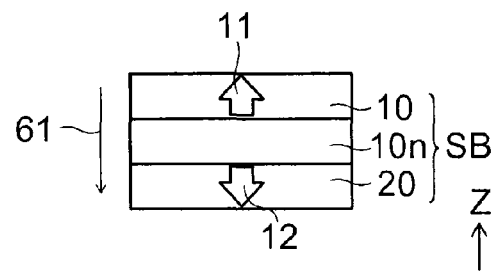

FIG. 7A and FIG. 7B are schematic views showing the operation of the nonvolatile memory device according to the first embodiment.

These drawings show states of the stacked body SB in the read-out operation of the magnetic memory element 110. The magnetic field application unit MU, the first conductive layer 81, and the second conductive layer 82 are not shown in these drawings.

FIG. 7A shows the case where the direction of the magnetization 11 of the first ferromagnetic layer 10 is the same as the direction of the magnetization 12 of the second ferromagnetic layer 20. FIG. 7B shows the case where the direction of the magnetization 11 of the first ferromagnetic layer 10 is antiparallel (reversely oriented) to the direction of the magnetization 12 of the second ferromagnetic layer 20.

As shown in FIG. 7A and FIG. 7B, a sense current 61 is caused to flow in the stacked body SB; and the electrical resistance is sensed. In the case of the normal magnetoresistance effect, the resistance in the state of FIG. 7A is lower than the resistance in the state of FIG. 7B. In the case of the reverse magnetoresistance effect, the resistance in the state of FIG. 7A is higher than the resistance in the state of FIG. 7B.

It is possible to read a record of binary data by associating the multiple states having mutually different resistances with "0" and "1" respectively. The orientation of the sense current 61 may be reversely oriented with respect to the direction shown in FIG. 7A and FIG. 7B.

FIG. 8A to FIG. 8D are graphs showing operations of the nonvolatile memory device according to the first embodiment.

Figure 8A:
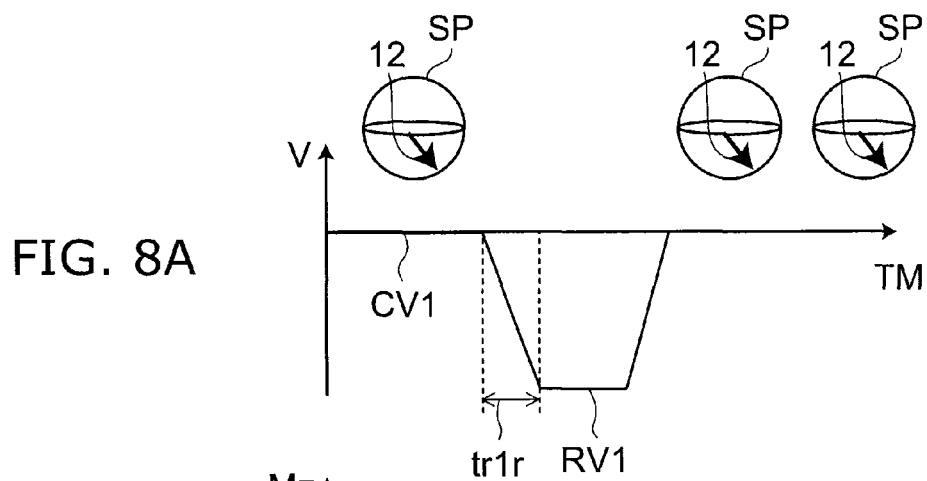
FIG. 8A to FIG. 8D are graphs showing operations of the nonvolatile memory device according to the first embodiment.
Figure 8B:
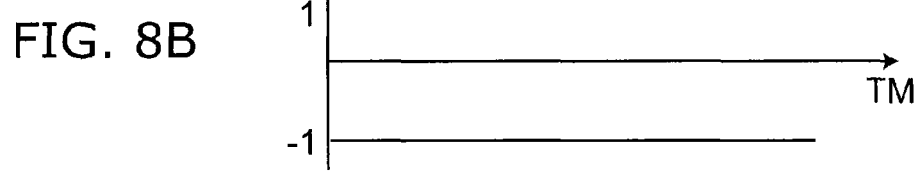
Figure 8C:
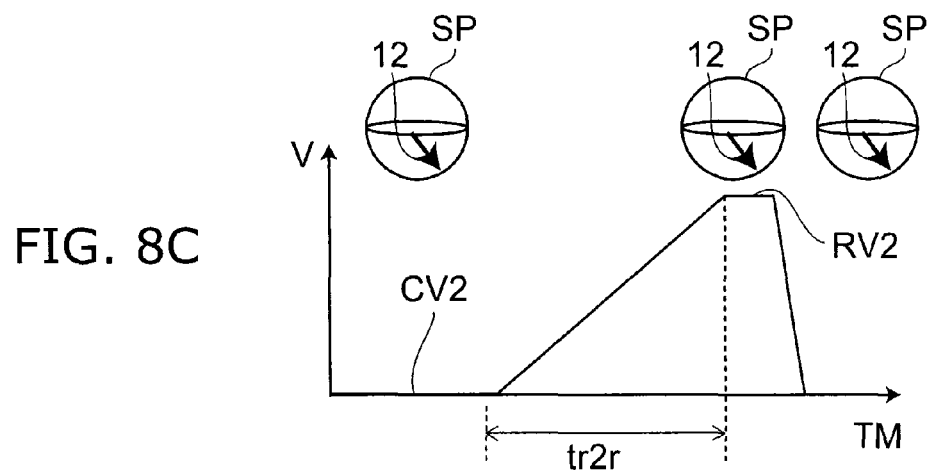
Figure 8D:
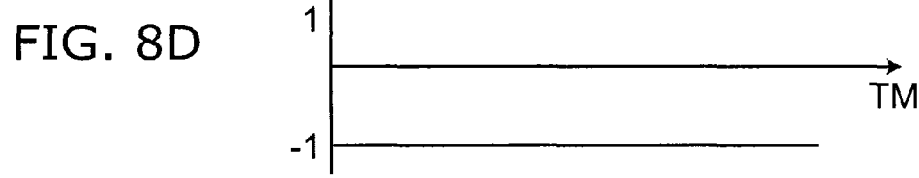

In FIG. 8A to FIG. 8D, the horizontal axis is the time TM. In FIG. 8A and FIG. 8C, the vertical axis is the voltage that is applied. In FIG. 8B and FIG. 8D, the vertical axis is the normalized value Mz.

FIG. 8A and FIG. 8B show a first read-out method of the magnetic memory element 110. FIG. 8C and FIG. 8D show a second read-out method of the magnetic memory element 110. The two read-out methods may be used in the magnetic memory element 110. In other words, two methods for supplying the sense current 61 may be used in the magnetic memory element 110.

In the first read-out method of the magnetic memory element 110 as shown in FIG. 8A and FIG. 8B, the voltage between the first ferromagnetic layer 10 and the second ferromagnetic layer 20 of the magnetic memory element 110 is changed from a first reference voltage CV1 to a first read-out voltage RV1. Similarly to the first set voltage SV1, the first reference voltage CV1 may be the ground potential, may have a prescribed potential difference from the ground potential, or may be a floating potential. In the description hereinbelow, the first reference voltage CV1 is a floating potential. The first read-out voltage RV1 is, for example, a pulse voltage. The polarity of the first read-out voltage RV1 is the reverse of the polarity of the second set voltage SV2. For example, when the second set voltage SV2 has a positive polarity, a negative polarity is used for the first read-out voltage RV1. A rising time tr1r of the first read-out voltage RV1 may be longer than the relaxation time $\tau_{relax}$ or may be shorter than the relaxation time $\tau_{relax}$. The sense current 61 is supplied to the magnetic memory element 110 by the application of the first read-out voltage RV1; and the direction of the magnetization 12 of the second ferromagnetic layer 20 can be read.

In the anisotropy modulation by the voltage, the change of the direction of the easy magnetization axis EA due to the application of the voltage of the reverse polarity is smaller than the change of the direction of the easy magnetization axis EA due to the application of the voltage of the forward polarity. The direction of the easy magnetization axis EA substantially does not change in the application of the voltage of the reverse polarity. In other words, in the application of the voltage of the reverse polarity, the component of the magnetization in the in-plane direction SD2 does not exceed the component of the magnetization in the stacking direction SD1. Thereby, in the application of the first read-out voltage RV1, misprogramming when supplying the sense current 61 is suppressed.

In the second read-out method of the magnetic memory element 110 as shown in FIG. 8C and FIG. 8D, the voltage between the first ferromagnetic layer 10 and the second ferromagnetic layer 20 of the magnetic memory element 110 is changed from a second reference voltage CV2 to a second read-out voltage RV2. Similarly to the first set voltage SV1 and the first reference voltage CV1, the second reference voltage CV2 may be the ground potential, may have a prescribed potential difference from the ground potential, or may be a floating potential. In the description hereinbelow, the second reference voltage CV2 is a floating potential. The second read-out voltage RV2 is, for example, a pulse voltage. The polarity of the second read-out voltage RV2 is the same as the polarity of the second set voltage SV2. A rising time tr2r of the second read-out voltage RV2 is longer than the relaxation time $\tau_{relax}$.

In the case where the rising time tr2r is longer than the relaxation time $\tau_{relax}$, the magnetization 12 is not switched to the state of being oriented in the in-plane direction SD2 even if the magnetic anisotropy of the second ferromagnetic layer 20 is modulated when the voltage is applied. Accordingly, the sense current 61 is supplied to the magnetic memory element 110 by the application of the second read-out voltage RV2; and the direction of the magnetization 12 of the second ferromagnetic layer 20 can be read. In the application of the second read-out voltage RV2 as well, the misprogramming when supplying the sense current 61 is suppressed.

For example, the first read-out method and the second read-out method recited above are implemented by the control unit 550. The control unit 550 further implements, for example, a first read-out operation of changing the voltage between the first ferromagnetic layer 10 and the second ferromagnetic layer 20 from the first reference voltage CV1 to the first read-out voltage RV1. The control unit 550 further implements, for example, a second read-out operation of changing the voltage between the first ferromagnetic layer 10 and the second ferromagnetic layer 20 from the second reference voltage CV2 to the second read-out voltage RV2. The control unit 550 may implement both the first read-out operation and the second read-out operation or may implement only one selected from the first read-out operation and the second read-out operation.

Results of simulations implemented by the inventors of the application will now be described.

FIG. 9A to FIG. 9F are schematic views showing other magnetic memory elements according to the first embodiment.

FIG. 9A to FIG. 9F show the configurations of magnetic memory elements 111 to 113 (simulation models) examined by simulation.

FIG. 9A is a schematic plan view of the magnetic memory element 111; and FIG. 9B is a schematic cross-sectional view of the magnetic memory element 111.

FIG. 9C is a schematic plan view of the magnetic memory element 112; and FIG. 9D is a schematic cross-sectional view of the magnetic memory element 112.

FIG. 9E is a schematic plan view of the magnetic memory element 113; and FIG. 9F is a schematic cross-sectional view of the magnetic memory element 113. The first conductive layer 81, the second conductive layer 82, and the control unit 550 are not shown in FIG. 9A to FIG. 9F.

The simulations are performed by numerical integration of the Langevin equation by the Monte Carlo method. More specifically, a random magnetic field that reflects the heat fluctuation and the effect of spin torque is added to the LLG (Landau-Lifshitz-Gilbert) equation, which is a differential equation that describes the precession of the magnetization vector in a magnetic field; and numerical computation of the resulting equation is performed using a macro-spin model. The effect in which the magnetic anisotropy of the second ferromagnetic layer 20 changes due to the change from the first set voltage SV1 to the second set voltage SV2 can be included by, for example, changing the anisotropic magnetic field of the second ferromagnetic layer 20 in the equation.

In the magnetic memory element 111 as shown in FIG. 9A and FIG. 9B, the configuration projected onto the X-Y plane is substantially circular. In the magnetic memory element 111, a length Lx1 of the second ferromagnetic layer 20 along the X-axis direction (the first in-plane direction) is substantially the same as a length Ly1 of the second ferromagnetic layer 20 along the Y-axis direction (the second in-plane direction). Therefore, the second ferromagnetic layer 20 of the magnetic memory element 111 substantially has no shape anisotropy field.

In the magnetic memory element 112 as shown in FIG. 9C and FIG. 9D, the configuration projected onto the X-Y plane is elliptical. In the magnetic memory element 112, a length Lx2 of the second ferromagnetic layer 20 in the X-axis direction is shorter than a length Ly2 of the second ferromagnetic layer 20 in the Y-axis direction. Therefore, the second ferromagnetic layer 20 of the magnetic memory element 112 has a shape anisotropy field SMy that has a Y-axis direction component. In the magnetic memory element 112, the magnetic field MF is applied from the magnetic field application unit MU in a direction perpendicular to the shape anisotropy field SMy of the second ferromagnetic layer 20.

In the magnetic memory element 113 as shown in FIG. 9E and FIG. 9F, the configuration projected onto the X-Y plane is elliptical. In the magnetic memory element 113, a length Lx3 of the second ferromagnetic layer 20 in the X-axis direction is longer than a length Ly3 of the second ferromagnetic layer 20 in the Y-axis direction. Therefore, the second ferromagnetic layer of the magnetic memory element 113 has a shape anisotropy field SMx that has an X-axis direction component. In the magnetic memory element 113, the magnetic field MF is applied from the magnetic field application unit MU in a direction parallel to the shape anisotropy field SMx of the second ferromagnetic layer 20.

In the simulations, the component $H_{dx}$ in the X-axis direction of the anisotropic magnetic field of the second ferromagnetic layer 20 is the shape anisotropy field of the second ferromagnetic layer 20; and the relationship between the direction of the shape anisotropy field of the second ferromagnetic layer 20 and the direction of the magnetic field MF of the magnetic field application unit MU is examined. In the example, the component in the second in-plane direction (the Y-axis direction) of the anisotropic magnetic field of the second ferromagnetic layer 20 is taken as $H_{dy}$. In the example, the direction of $H_{dx}$ is substantially parallel to the direction of the magnetic field MF; and the direction of $H_{dy}$ is substantially perpendicular to the direction of the magnetic field MF.

The second ferromagnetic layer 20 of the magnetic memory element 111 does not have a shape anisotropy field. Therefore, in the magnetic memory element 111, $H_{dx}$=0 Oe; and $H_{dy}$=0 Oe. The second ferromagnetic layer 20 of the magnetic memory element 112 has the shape anisotropy field SMy that has the second in-plane-direction component. In the magnetic memory element 112, for example, $H_{dx}$=0 Oe; and $H_{dy}$=1000 Oe. The second ferromagnetic layer 20 of the magnetic memory element 113 has the shape anisotropy field SMx that has the first in-plane-direction component. In the magnetic memory element 113, for example, $H_{dx}$=500 Oe; and $H_{dy}$=0 Oe.

In the simulations, the nine models of a first model M1 to a ninth model M9 are applied for each of the magnetic memory elements 111 to 113.

In the first model M1, a third ferromagnetic layer 30 for which $H_{ext}$=100 Oe is applied as the magnetic field application unit MU.

In the second model M2, a third ferromagnetic layer 30 for which $H_{ext}$=200 Oe is applied as the magnetic field application unit MU.

In the third model M3, a third ferromagnetic layer 30 for which $H_{ext}$=300 Oe is applied as the magnetic field application unit MU.

In the fourth model M4, a third ferromagnetic layer 30 for which $H_{ext}$=400 Oe is applied as the magnetic field application unit MU.

In the fifth model M5, a third ferromagnetic layer 30 for which $H_{ext}$=500 Oe is applied as the magnetic field application unit MU.

In the sixth model M6, a third ferromagnetic layer 30 for which $H_{ext}$=600 Oe is applied as the magnetic field application unit MU.

In the seventh model M7, a third ferromagnetic layer 30 for which $H_{ext}$=700 Oe is applied as the magnetic field application unit MU.

In the eighth model M8, a third ferromagnetic layer 30 for which $H_{ext}$=800 Oe is applied as the magnetic field application unit MU.

In the ninth model M9, a third ferromagnetic layer 30 for which $H_{ext}$=900 Oe is applied as the magnetic field application unit MU.

In the simulations, the second ferromagnetic layer 20 for which $H_u$=1000 Oe is applied for each of the first model M1 to the ninth model M9 of the magnetic memory elements 111 to 113.

In the simulations, the case is examined where the second set voltage SV2 having different voltage values is multiply applied for each of the first model M1 to the ninth model M9 of the magnetic memory elements 111 to 113. Thereby, a switching time ST (ns (nanoseconds)) is evaluated for ΔH in the range of 0 Oe to 1000 Oe. The switching time ST is the time for the magnetization 12 of the second ferromagnetic layer 20 to change from the first direction to the second direction or from the second direction to the first direction after the change from the first set voltage SV1 to the second set voltage SV2. In the example, this is the time for the magnetization 12 to change from upward to downward or the time for the magnetization 12 to change from downward to upward. Hereinbelow, the change of the magnetization 12 from the first direction to the second direction or the change of the magnetization 12 from the second direction to the first direction is called switching. In the simulations, the switching time ST is determined by calculation. In experiments, for example, the period of the reversal of the magnetization 12 can be observed by applying a pulse having a rising time that is shorter than $\tau_{relax}$ to the magnetic memory element and using a sampling oscilloscope to observe the change of the resistance value in the conduction. It is possible to determine the switching time ST from the reversal period.

FIG. 10A, FIG. 10B, FIG. 11A, FIG. 11B, FIG. 12A, and FIG. 12B are graphs showing characteristics of other nonvolatile memory devices according to the first embodiment.

Figure 10A:
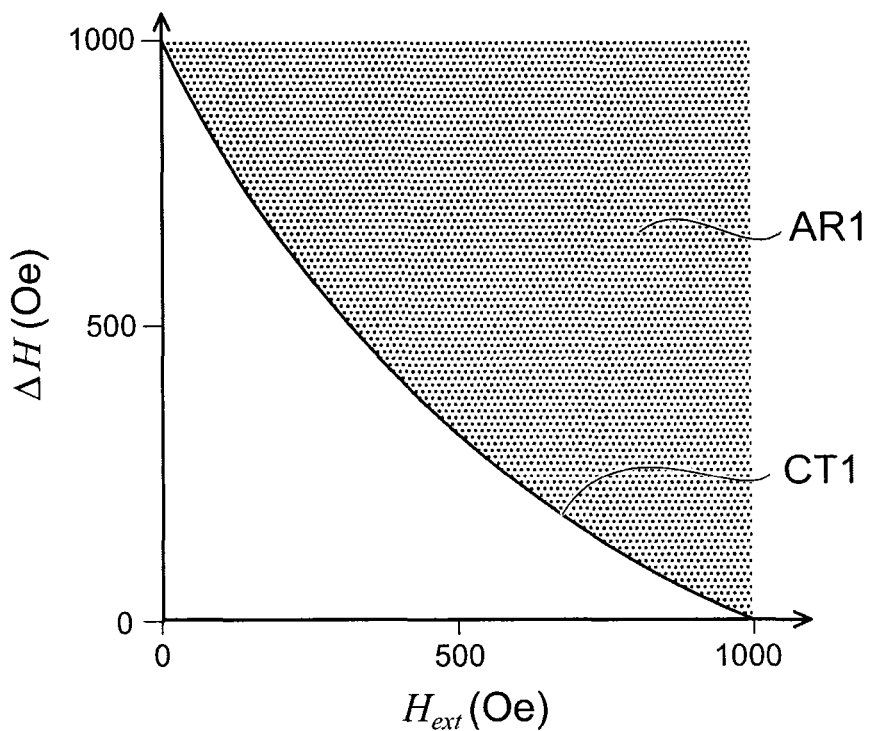
FIG. 10A, FIG. 10B, FIG. 11A, FIG. 11B, FIG. 12A, and FIG. 12B are graphs showing characteristics of other nonvolatile memory devices according to the first embodiment.
Figure 10B:
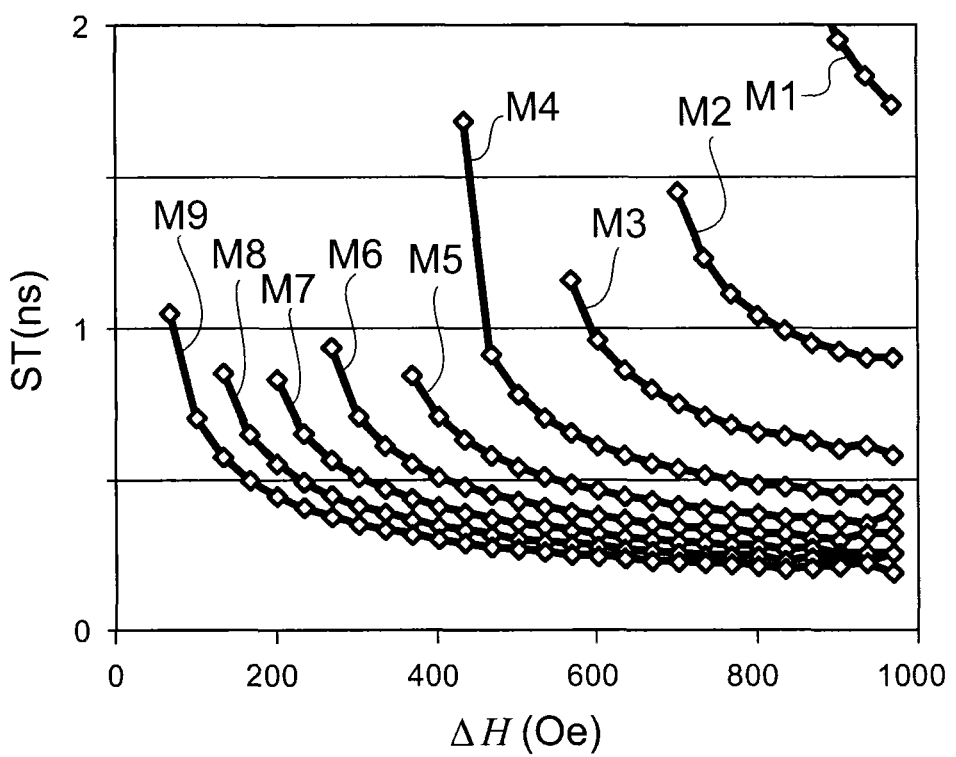

FIG. 10A and FIG. 10B are graphs showing the simulation results of the first model M1 to the ninth model M9 of the magnetic memory element 111.

Figure 11A:
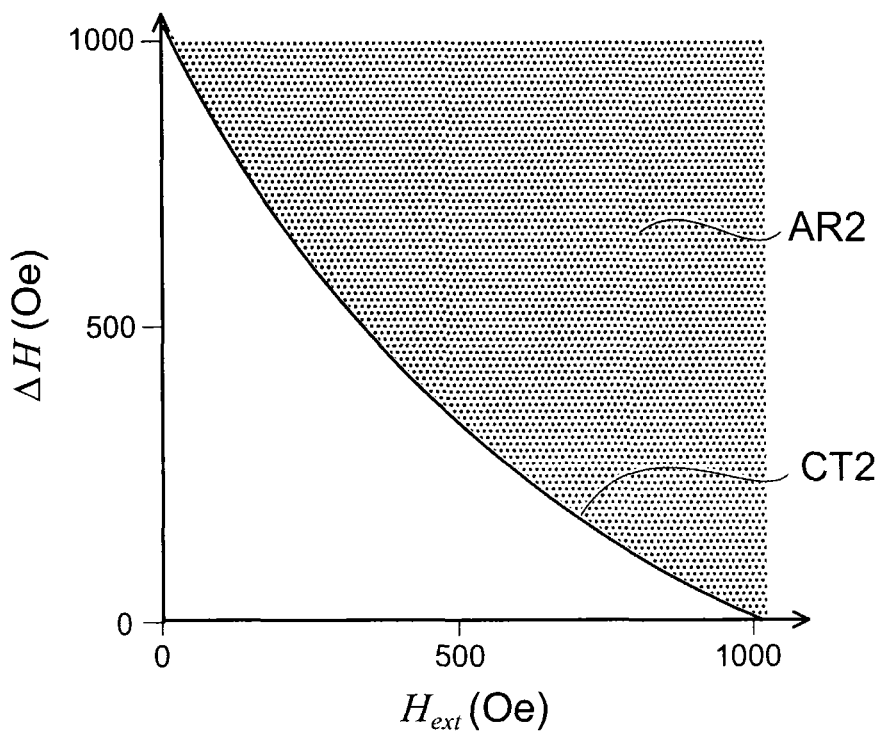
Figure 11B:
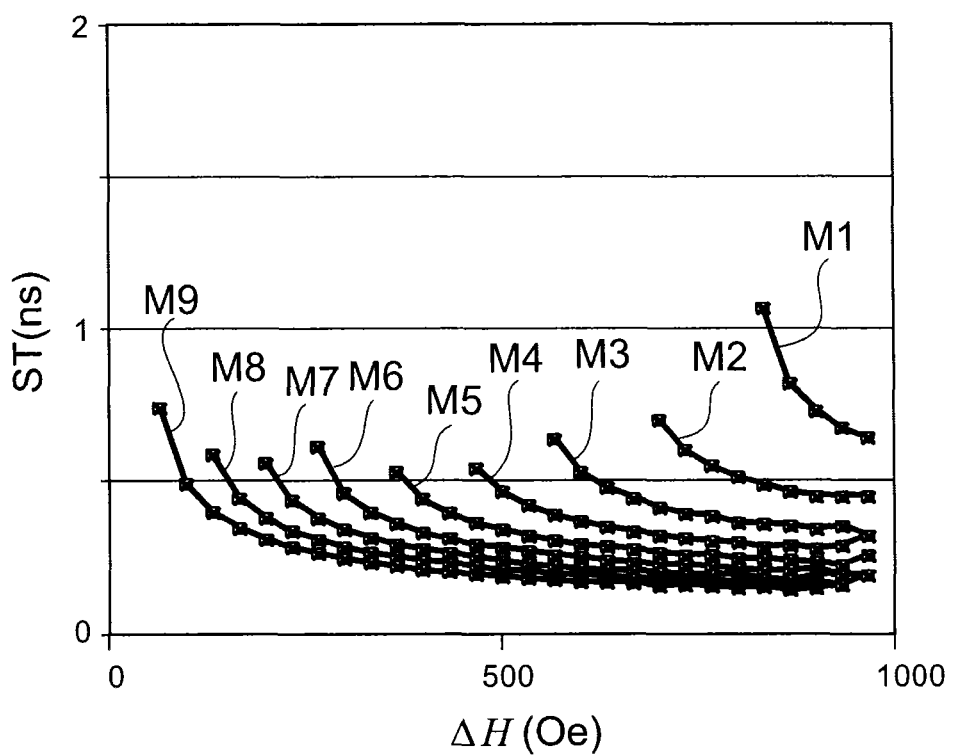

FIG. 11A and FIG. 11B are graphs showing the simulation results of the first model M1 to the ninth model M9 of the magnetic memory element 112.

Figure 12A:
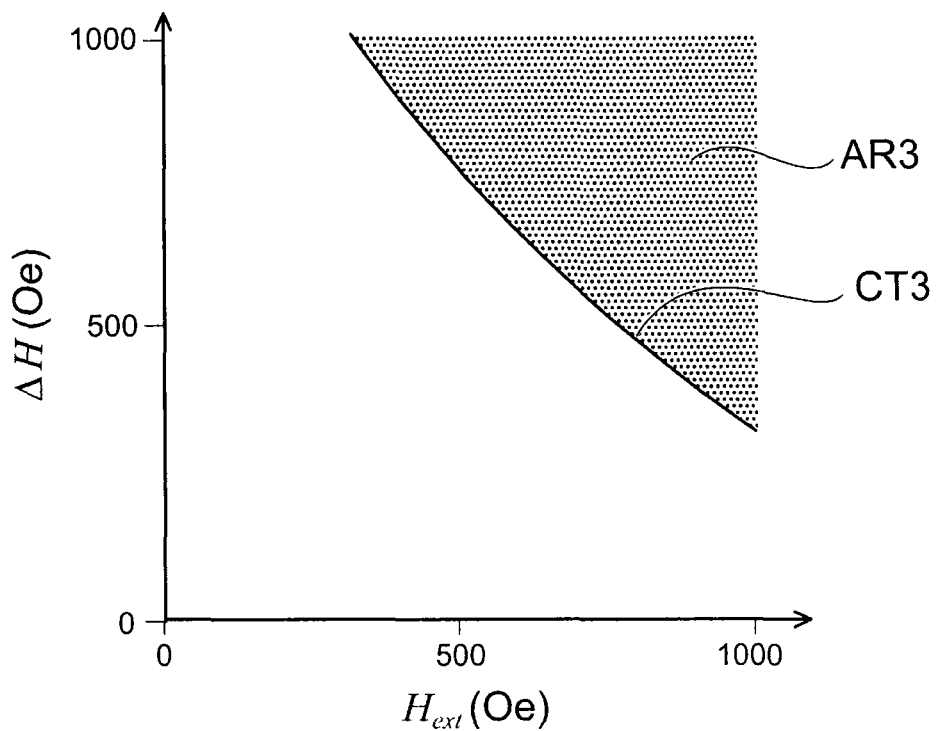
Figure 12B:
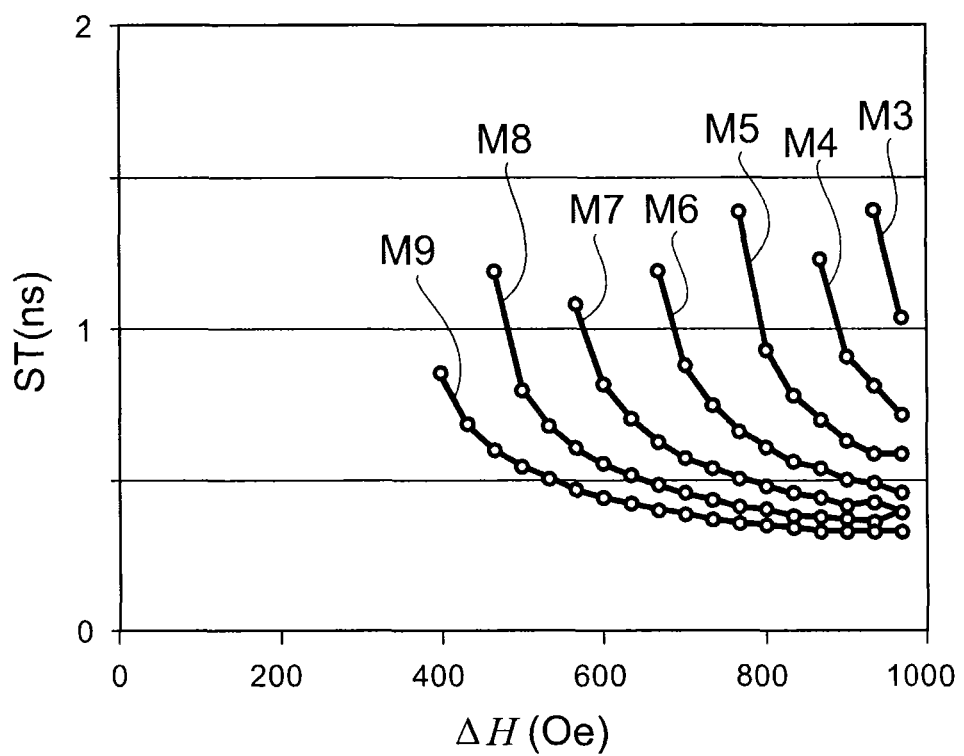

FIG. 12A and FIG. 12B are graphs showing the simulation results of the first model M1 to the ninth model M9 of the magnetic memory element 113.

In FIG. 10A, FIG. 11A, and FIG. 12A, the horizontal axis is $H_{ext}$ (Oe); and the vertical axis is ΔH (Oe).

In FIG. 10B, FIG. 11B, and FIG. 12B, the horizontal axis is ΔH (Oe); and the vertical axis is the switching time ST (ns).

FIG. 10A shows a region AR1 where the condition of Formula (1) is satisfied for the magnetic memory element 111 of the conditions recited above. The region AR1 is the crosshatched portion in FIG. 10A. A characteristic CT1 shown in FIG. 10A corresponds to the right side of Formula (1) for the magnetic memory element 111. When $H_{ext}$ and ΔH have a relationship inside the region AR1, the condition of Formula (1) is satisfied for the magnetic memory element 111.

In the magnetic memory element 111 as shown in FIG. 10B, switching is observed for each of the first model M1 to the ninth model M9. The switching time ST shortens as $H_{ext}$ is increased. Also, the switching time ST shortens as ΔH is increased. Thus, the switching time ST correlates with $H_{ext}$ and ΔH.

For the characteristics of each of the first model M1 to the ninth model M9 shown in FIG. 10B, the switching time ST is in a range not more than 2 ns. For example, for the second model M2, the switching time ST becomes larger than 2 ns in the case where ΔH is not more than about 700 Oe. From the results of numerical analysis, the inventors of the application discovered that the period of the precession destabilizes at 2 ns or more. This is because, when considering the time to cross the upper hemisphere or the lower hemisphere, it is desirable for the time used as the pulse width to be not more than half of the time to cross the upper hemisphere or the lower hemisphere. Therefore, careful attention is given to cases of reversing at not more than 1 ns. Therefore, in the simulations, the conditions at which the switching time ST is not more than 1 ns are examined. For example, for the second model M2 of the magnetic memory element 111, the range where the switching time ST is not more than 1 ns is ΔH>840 Oe. In the simulations, the range where the switching time ST is not more than 1 ns is the range where the condition of Formula (1) is satisfied. Thus, it is favorable for $H_{ext}$ and ΔH to be set to satisfy the condition of Formula (1) and to be in the range where the switching time ST is not more than 1 ns.

FIG. 11A shows a region AR2 where the condition of Formula (1) is satisfied for the magnetic memory element 112 of the conditions recited above. The region AR2 is the crosshatched portion in FIG. 11A. A characteristic CT2 shown in FIG. 11A corresponds to the right side of Formula (1) for the magnetic memory element 112. The condition of Formula (1) is satisfied for the magnetic memory element 112 when $H_{ext}$ and ΔH have a relationship inside the region AR2. For both the magnetic memory element 111 and the magnetic memory element 112, $H_{dx}$=0 Oe. Accordingly, the characteristic CT2 of the magnetic memory element 112 is the same as the characteristic CT1 of the magnetic memory element 111.

As shown in FIG. 11B, switching is observed for each of the first model M1 to the ninth model M9 for the magnetic memory element 112. In the magnetic memory element 112 as well, the switching time ST correlates with $H_{ext}$ and ΔH.

FIG. 12A shows a region AR3 where the condition of Formula (1) is satisfied for the magnetic memory element 113 of the conditions recited above. The region AR3 is the crosshatched portion in FIG. 12A. A characteristic CT3 shown in FIG. 12A corresponds to the right side of Formula (1) for the magnetic memory element 113. The condition of Formula (1) is satisfied for the magnetic memory element 113 when $H_{ext}$ and ΔH have a relationship inside the region AR3. $H_{dx}$ of the magnetic memory element 113 is 500 Oe and is different from $H_{dx}$ of the magnetic memory element 111 and $H_{dx}$ of the magnetic memory element 112. Accordingly, the characteristic CT3 of the magnetic memory element 113 is different from the characteristic CT1 of the magnetic memory element 111 and the characteristic CT2 of the magnetic memory element 112.

The region AR3 of the magnetic memory element 113 is narrower than the region AR1 of the magnetic memory element 111 and the region AR2 of the magnetic memory element 112. In other words, in the magnetic memory element 113, the lower limit of $H_{ext}$ and the lower limit of ΔH necessary to cause the switching of the magnetization 12 are higher than those in the magnetic memory element 111 and the magnetic memory element 112. It is necessary for $H_{ext}$ or $\Delta H$ to be larger for the magnetic memory element 113 than for the magnetic memory element 111 and the magnetic memory element 112 to cause the switching of the magnetization 12.

As shown in FIG. 12B, switching that has a switching time ST of 2 ns or less is observed for the third model M3 to the ninth model M9 for the magnetic memory element 113. On the other hand, for the first model M1 and the second model M2 of the magnetic memory element 113, switching that has a switching time ST of 2 ns or less is not observed within the computation range. For the magnetic memory element 113, $H_{ext}$ that is necessary in the case where $\Delta H$ is 1000 Oe is $H_{ext}>$300 Oe from Formula (1). Thus, in the case where $\Delta H$ is not more than 1000 Oe, the condition of Formula (1) is not satisfied in the range of $H_{ext}<$300 Oe.

The inventors of the application focused on the aspect that there are cases where switching of the magnetization 12 occurs and there are cases where switching of the magnetization 12 does not occur when changing the first set voltage SV1 to the second set voltage SV2. Then, by repeated investigations while changing the configuration of the magnetic memory element 110, the voltage value of the second set voltage SV2, etc., the inventors of the application discovered that appropriate switching of the magnetization 12 occurs when the condition of Formula (1) is satisfied. Thus, the occurrence of the appropriate switching of the magnetization 12 when the condition of Formula (1) is satisfied is a new effect resulting from the investigations of the inventors of the application.

In the nonvolatile memory device 610 according to the embodiment, the magnetic memory element 110 and the control unit 550 are configured to satisfy the condition of Formula (1). Thereby, the direction of the magnetization 12 of the second ferromagnetic layer 20 can be changed appropriately. In the nonvolatile memory device 610 according to the embodiment, stable operations can be obtained.

Further, the inventors of the application discovered that the conditions at which the switching of the magnetization 12 occurs are broader by reducing $H_{dx}$. The inventors of the application discovered that the effect of $H_{dy}$ on the switching of the magnetization 12 is smaller than the effect of $H_{dx}$. For example, $H_{dx}$ can be reduced by causing the length of the second ferromagnetic layer 20 in the first in-plane direction to be shorter than the length of the second ferromagnetic layer 20 in the second in-plane direction. Thereby, for example, the value of $\Delta H$ that is necessary for the switching of the magnetization 12 can be reduced. Thereby, for example, the degrees of freedom of the material selection of the second ferromagnetic layer 20, etc., can be increased. For example, $H_{dx}$ is set to be not more than 500 Oe. Thereby, the value of $\Delta H$ can be suppressed. As described above, $H_{dx}$ can be estimated from the demagnetizing factor Nd that comes from the saturation magnetization Ms and the configuration of the second ferromagnetic layer 20. Nd can be estimated by the formula according to Paper (2).

As shown in FIG. 10B and FIG. 11B, the change of the switching time ST is small in the range of $\Delta H$ being not less than 400 Oe in the case where $H_{dx}$ is reduced and $H_{ext}$ is not less than 600 Oe. For example, the switching time ST is constant at 0.5 ns. There are cases where the value of $\Delta H$ changes due to effects of the magnetic field around the second ferromagnetic layer 20, etc., when changing the first set voltage SV1 to the second set voltage SV2. Considering the calculation results of FIG. 12B, $H_{dx}$ is set to be not more than $0.5H_u$; and $H_{ext}$ is set to be not less than 600 Oe. Thereby, for example, the change of the switching time ST due to the change of $\Delta H$ can be suppressed. The operations of the nonvolatile memory device 610 can be stabilized further.

Examples of the configurations of each layer of the magnetic memory element 110 will now be described. The following description is applicable to any magnetic memory element according to the embodiment.

It is favorable for the first ferromagnetic layer 10 to include, for example, a metal material including at least one element selected from the group consisting of iron (Fe), cobalt (Co), nickel (Ni), manganese (Mn), and chrome (Cr). An alloy including the at least one selected from the group recited above and at least one metal selected from the group consisting of platinum (Pt), palladium (Pd), iridium (Ir), ruthenium (Ru), and rhodium (Rh) also may be used.

Characteristics of the first ferromagnetic layer 10 such as the compositions of the magnetic materials that are included, the magnetic anisotropy by heat treatment, etc., may be adjusted. The first ferromagnetic layer 10 may include a rare earth-transition metal amorphous alloy such as TbFeCo, GdFeCo, etc. The first ferromagnetic layer 10 may include a stacked structure of Co/Pt, Co/Pd, Co/Ni, etc. Co/Ru, Fe/Au, Ni/Cu, etc., become perpendicular magnetization films when combined with a foundation layer. By controlling the crystal orientation direction of the film, the first ferromagnetic layer 10 may include Co/Ru, Fe/Au, Ni/Cu, etc.

The resistance value per unit surface area of the first nonmagnetic layer 10n is, for example, not less than 1 $\Omega\mu m^2$ and not more than 20 $\Omega\mu m^2$. The first nonmagnetic layer 10n may include, for example, an oxide, a nitride, a fluoride, or the like of aluminum, magnesium, hafnium, cerium, strontium, tantalum, titanium, etc. For example, the change of the magnetic anisotropy energy of the first ferromagnetic layer 10 due to the change from the first set voltage SV1 to the second set voltage SV2 depends on the stored charge amount at the interface between the first ferromagnetic layer 10 and the first nonmagnetic layer 10n. Therefore, it is favorable for a paraelectric material having a high relative dielectric constant at room temperature to be used as the material of the first nonmagnetic layer 10n.

In the case where the programming and the reading have the same voltage polarity (in the case of the second read-out method), it is desirable for the spin polarization of the second ferromagnetic layer 20 not to be too high. Thereby, misprogramming due to the spin-transfer torque can be suppressed in the reading. Also, the voltage margin of the programming and the reading can be widened.

The second ferromagnetic layer 20 may include, for example, a layer made of a magnetic element such as iron (Fe), cobalt (Co), nickel (Ni), etc., an alloy of a magnetic element, an alloy that is magnetic, an oxide (ferrite), a compound, alloy or the like including a magnetic element and a rare-earth element of neodymium (Nd), samarium (Sm), terbium (Tb), etc.

Also, the second ferromagnetic layer 20 may include a layer made of an alloy, ordered alloy, or multilayered stacked structure of one selected from Pt, Pd, Ru, and Re and one selected from Fe, Co, and Ni as a magnetic transition metal. The second ferromagnetic layer 20 has a film thickness such that the transition between the in-plane magnetic anisotropy and the perpendicular magnetic anisotropy occurs due to the electric field at the interface between the second ferromagnetic layer 20 and the first nonmagnetic layer 10n. The film thickness of the second ferromagnetic layer 20 is, for example, not less than 0.5 nm and not more than 3.5 nm.

In the case where the voltage polarity of the programming and the reading is changed (in the case of the first read-out method), the voltage margin of the programming and the reading can be widened. In such a case, the second ferromagnetic layer may include, for example, a layer made of a magnetic element such as iron (Fe), cobalt (Co), nickel (Ni), etc., an alloy of a magnetic element, an alloy that is magnetic, an oxide (ferrite), a compound, alloy or the like including a magnetic element and a rare-earth element of neodymium (Nd), samarium (Sm), terbium (Tb), etc. In the case where the first read-out method is used, the second ferromagnetic layer 20 also may include a layer made of an alloy, ordered alloy, or multilayered stacked structure of one selected from Pt, Pd, Ru, and Re and one selected from Fe, Co, and Ni as a magnetic transition metal. A half-metal may be used as the second ferromagnetic layer 20.

The third ferromagnetic layer 30 may include, for example, substantially the same materials as the first ferromagnetic layer 10 and the second ferromagnetic layer 20. The second nonmagnetic layer 20n may include, for example, a nonmagnetic metal layer, a nonmagnetic tunneling barrier layer, etc.

The nonmagnetic metal layer may include, for example, one nonmagnetic metal selected from the group consisting of copper (Cu), silver (Ag), gold (Au), chrome (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), and bismuth (Bi) or an alloy including at least two nonmagnetic metals selected from the group recited above.

The nonmagnetic tunneling barrier layer includes an insulating material. The nonmagnetic tunneling barrier layer may include, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe).

The nonmagnetic tunneling barrier layer may be, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, etc. Also, the nonmagnetic tunneling barrier layer may be, for example, a nonmagnetic semiconductor (ZnOx, InMn, GaN, GaAs, TiOx, Zn, Te, or one of these doped with a transition metal), etc.

It is desirable for the thickness of the nonmagnetic tunneling barrier layer to have a value in the range of not less than about 0.2 nanometers (nm) and not more than about 2.0 nm. Thereby, for example, a resistance that is excessively high is prevented while ensuring uniformity of the insulating film.

For example, the first nonmagnetic layer 10n and the second nonmagnetic layer 20n include insulators (nonmagnetic tunneling barrier layers); and the second ferromagnetic layer 20 contacts the first nonmagnetic layer 10n and the second nonmagnetic layer 20n. In such a case, when changing the first set voltage SV1 to the second set voltage SV2, the orientation of the electric field applied at the interface between the second ferromagnetic layer 20 and the first nonmagnetic layer 10n is substantially the same as the orientation of the electric field applied at the interface between the second ferromagnetic layer 20 and the second nonmagnetic layer 20n. Thereby, for example, the change of the magnetic anisotropy of the second ferromagnetic layer 20 when changing the first set voltage SV1 to the second set voltage SV2 can be increased.

The first conductive layer 81 and the second conductive layer 82 may include, for example, a magnetic material that is conductive or a nonmagnetic material that is conductive. The magnetic material that is conductive may include, for example, substantially the same materials as the materials used in the first ferromagnetic layer 10 and the second ferromagnetic layer 20.

The nonmagnetic material that is conductive that is included in the first conductive layer 81 and the second conductive layer 82 may include, for example, one metal selected from the group consisting of gold (Au), copper (Cu), chrome (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al) or an alloy including at least two metals selected from the group recited above. The nonmagnetic material that is conductive that is included in the first conductive layer 81 and the second conductive layer 82 may be at least one selected from a conductive nitride, conductive oxide, or conductive fluoride including at least one element selected from the group recited above. The nonmagnetic material that is conductive that is included in the first conductive layer 81 and the second conductive layer 82 may be a carbon nanotube, a carbon nanowire, graphene, etc.

There are cases where a transistor is directly or indirectly connected to the first conductive layer 81 and/or the second conductive layer 82. In such a case, for example, the source portion and/or the drain portion of the transistor may be used as the first conductive layer 81 and/or the second conductive layer 82 recited above. Or, in such a case, for example, contact members connected to the source portion and/or the drain portion of the transistor may be used as the first conductive layer 81 and/or the second conductive layer 82 recited above.

The configuration of the stacked body SB and the configuration of the magnetic field application unit MU when projected onto the X-Y plane are arbitrary. The configuration of the stacked body SB and the configuration of the magnetic field application unit MU when projected onto the X-Y plane may be, for example, a circle, an ellipse, a flattened circle, a polygon, etc. In the case of a polygon, it is favorable to have three or more corners such as a quadrilateral, a hexagon, etc. Also, the polygon may have rounded corners.

An example of a method for manufacturing the magnetic memory element 110 according to the first embodiment will now be described.

After forming a lower electrode (not shown) on the wafer, the wafer is disposed inside an ultra high vacuum sputtering apparatus. Then, a Ta/Ru layer (a contact layer for the electrode/stopper layer), an FePd/CoFeB layer (the second ferromagnetic layer 20), a MgO layer (the first nonmagnetic layer 10n), a CoFeB/FePt layer (the first ferromagnetic layer 10), and a Ru layer (a cap layer) are stacked in this order on the lower electrode. Here, it is also possible to adjust the strength of the magnetic anisotropy in the direction perpendicular to the film surface between the FePd/CoFeB layer and the CoFeB/FePt layer by annealing in a magnetic field.

Then, a resist mask having a diameter of 20 nm is formed by coating an EB resist and performing EB exposure. The portion not covered with the resist is cut away by ion milling until the Ta layer on the stopper layer/lower electrode is exposed.

Continuing, the wafer is disposed inside an ultra high vacuum sputtering apparatus; and a Ru layer (the second nonmagnetic layer 20n) is stacked.

A resist is coated onto the entire surface of the patterning body; and the resist is patterned by a stepper lithography apparatus such that the portion at the position of the second nonmagnetic layer 20n is covered with the resist. The portion not covered with the resist is cut away by ion milling. After filling a $SiO_2$ film for insulating, lift-off of the resist is performed.

Then, the wafer is disposed inside an ultra high vacuum sputtering apparatus; an FePt/CoFeB/Cu/Py layer (the third ferromagnetic layer 30) is stacked; and a Ta layer (a contact layer for the electrode) is stacked on the FePt/CoFeB/Cu/Py layer in this order.

Continuing, after filling a $SiO_2$ film for insulating and planarizing the magnetic memory element 110 by CMP, etc., the contact layer for the electrode is exposed by etching the entire surface by RIE (Reactive Ion Etching), etc.

A resist is coated onto the entire surface of the patterning body; and the resist is patterned by a stepper lithography apparatus such that the portion at the position of a via is not covered with the resist. The portion not covered with the resist is cut away by ion milling; and the resist is removed.

A resist is coated onto the entire surface of the patterning body; and the resist is patterned by a stepper lithography apparatus such that the portions at the positions of the via and the upper electrode are not covered with the resist. Cu is formed in a film to fill the openings corresponding to the via and the upper electrode; and the resist is removed. The electrical input/output to the upper electrode can be provided by providing a not-shown interconnect.

Thus, the magnetic memory element 110 is completed.

Figure 13A:
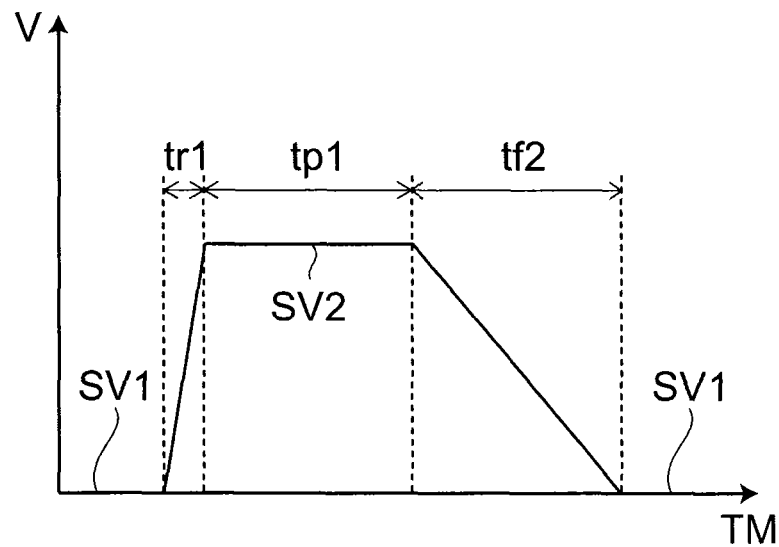
FIG. 13A and FIG. 13B are graphs showing other operations of the nonvolatile memory device according to the first embodiment.
Figure 13B:
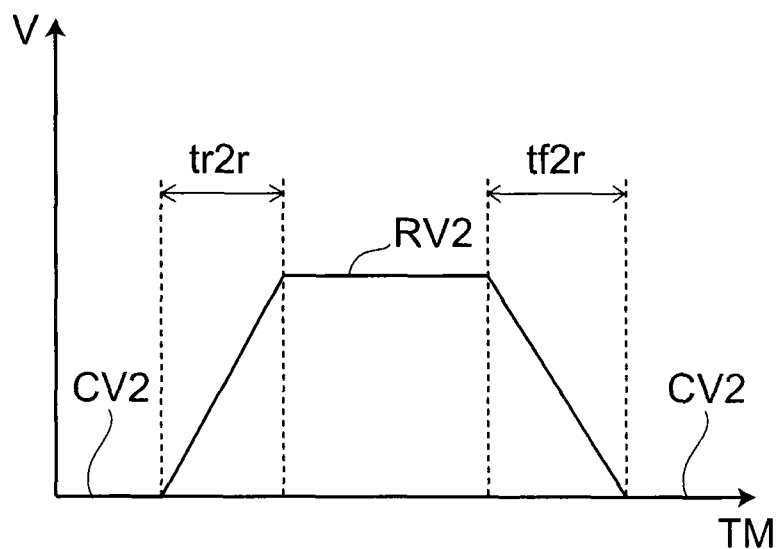

FIG. 13A and FIG. 13B are graphs showing other operations of the nonvolatile memory device according to the first embodiment.

In FIG. 13A and FIG. 13B, the horizontal axis is the time TM. In FIG. 13A and FIG. 13B, the vertical axis is the voltage that is applied.

In the example as shown in FIG. 13A, the first rising time tr1 of the second set voltage SV2 is $tr1 < \tau_{relax}$; and a second trailing time tf2 of the second set voltage SV2 is $tf2 > \tau_{relax}$. The second trailing time tf2 is, for example, the time of changing back to the first set voltage SV1 from the second set voltage SV2. Thereby, a more stable programming operation can be performed. The second set voltage SV2 that has the first rising time tr1 and the second trailing time tf2 may be applied to both the first read-out method and the second read-out method.

In the example as shown in FIG. 13B, the rising time tr2r of the second read-out voltage RV2 is $tr2r > \tau_{relax}$; and a trailing time tf2r of the second read-out voltage RV2 is $tf2r > \tau_{relax}$. Thereby, the misprogramming due to the application of the second read-out voltage RV2 can be suppressed more appropriately.

FIG. 14A to FIG. 14E are schematic cross-sectional views showing other magnetic memory elements according to the first embodiment.

Figure 14A:
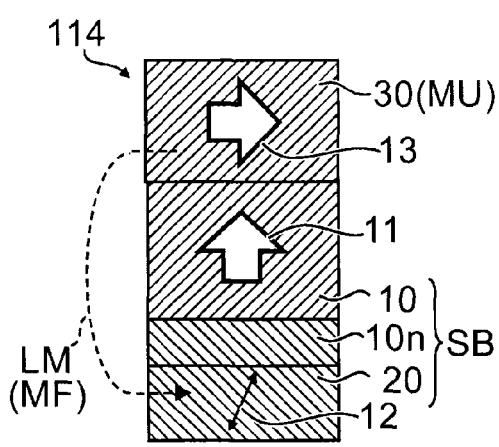
FIG. 14A to FIG. 14E are schematic cross-sectional views showing other magnetic memory elements according to the first embodiment.

In a magnetic memory element 114 as shown in FIG. 14A, the third ferromagnetic layer 30 is provided on the first ferromagnetic layer 10. In the magnetic memory element 114, for example, the third ferromagnetic layer 30 contacts the first ferromagnetic layer 10. Thus, the leakage magnetic field LM from the third ferromagnetic layer 30 may be applied to the second ferromagnetic layer 20 by providing the third ferromagnetic layer 30 on the first ferromagnetic layer 10.

Figure 14B:
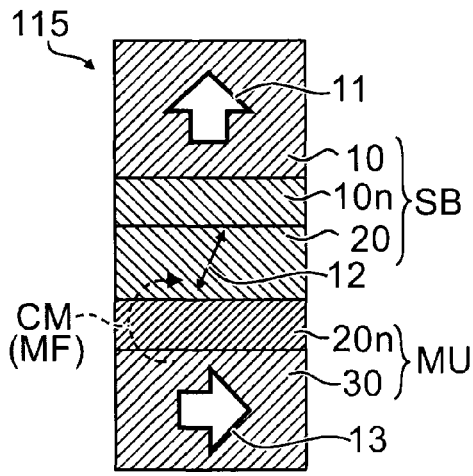

In a magnetic memory element 115 as shown in FIG. 14B, the third ferromagnetic layer 30 has exchange coupling with the second ferromagnetic layer 20 via the second nonmagnetic layer 20n. Thus, an exchange coupling field CM from the third ferromagnetic layer 30 may be applied to the second ferromagnetic layer 20 by the third ferromagnetic layer 30 having exchange coupling with the second ferromagnetic layer 20.

In the case where the second ferromagnetic layer 20 and the third ferromagnetic layer 30 have exchange coupling, the second nonmagnetic layer 20n may include, for example, one metal selected from the group consisting of ruthenium (Ru), osmium (Os), and iridium (Ir) or an alloy including at least two metals selected from the group. The thickness of the second nonmagnetic layer 20n is, for example, not more than 3 nm. Thereby, a sufficiently strong exchange coupling field CM is obtained via the second nonmagnetic layer 20n.

Figure 14C:
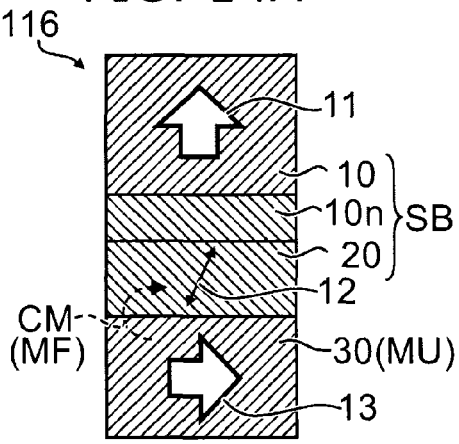

In a magnetic memory element 116 as shown in FIG. 14C, the third ferromagnetic layer 30 contacts the second ferromagnetic layer 20. Thus, the exchange coupling field CM from the third ferromagnetic layer 30 may be applied to the second ferromagnetic layer 20 by the third ferromagnetic layer 30 contacting the second ferromagnetic layer 20 and the second ferromagnetic layer 20 having direct exchange coupling with the third ferromagnetic layer 30.

Figure 14D:
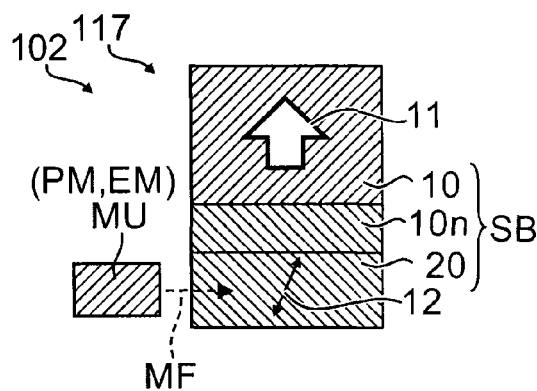

In a memory unit 102 according to the embodiment as shown in FIG. 14D, the magnetic field application unit MU is not stacked with the stacked body SB of a magnetic memory element 117. In the example, for example, the magnetic field application unit MU applies the magnetic field MF to the second ferromagnetic layer 20 as an external magnetic field. In such a case, the magnetic field application unit MU may include, for example, a permanent magnet PM, an electromagnet EM, etc. Thus, the magnetic field application unit MU may not be stacked with the stacked body SB.

Figure 14E:
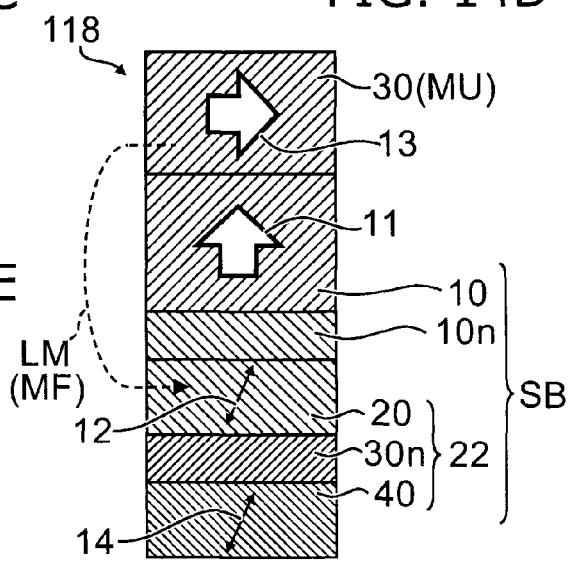

In a magnetic memory element 118 as shown in FIG. 14E, the stacked body SB further includes a fourth ferromagnetic layer 40 and a third nonmagnetic layer 30n. The fourth ferromagnetic layer 40 is stacked in the stacking direction SD1 on the second ferromagnetic layer 20 side. The direction of a magnetization 14 of the fourth ferromagnetic layer 40 is changeable. The third nonmagnetic layer 30n is provided between the second ferromagnetic layer 20 and the fourth ferromagnetic layer 40. The magnetization 14 of the fourth ferromagnetic layer 40 has exchange coupling with the magnetization 12 of the second ferromagnetic layer 20 via the third nonmagnetic layer 30n. Thereby, in the magnetic memory element 118, a stacked unit 22 including the second ferromagnetic layer 20, the fourth ferromagnetic layer 40, and the third nonmagnetic layer 30n is provided in the stacked body SB. The fourth ferromagnetic layer 40 may include, for example, substantially the same materials as the second ferromagnetic layer 20. The third nonmagnetic layer 30n may include, for example, substantially the same materials as the second nonmagnetic layer 20n described in regard to the magnetic memory element 115.

In the magnetic memory element 118, when changing from the first set voltage SV1 to the second set voltage SV2 and when the direction of the magnetization 12 of the second ferromagnetic layer 20 changes, the direction of the magnetization 14 of the fourth ferromagnetic layer 40 also accordingly changes to substantially the same direction as the magnetization 12. The thermal agitation resistance can be increased because the second ferromagnetic layer 20 is coupled to the fourth ferromagnetic layer 40 in a magnetostatic state. The magneto-crystalline anisotropy of a stacked unit 22 is, for example, the average of Ku1 and Ku2, where the magneto-crystalline anisotropy of the second ferromagnetic layer 20 is Ku1, and the magneto-crystalline anisotropy of the fourth ferromagnetic layer 40 is Ku2. Thereby, in the magnetic memory element 118, the Δ value of the memory retention can be increased. The Δ value is, for example, the ratio of the energy barrier necessary for the magnetization reversal of the stacked unit 22 and the thermal energy. The Δ value may be expressed by, for example, $\Delta = MsH_uV/2kBT$. In the formula, Ms is the saturation magnetization, V is the volume of the stacked unit 22, kB is the Boltzmann constant, and T is the absolute temperature of the magnetic memory element. The magnetization is stabilized as the Δ value increases. For example, the memory retention time increases.

In the magnetic memory elements 114 to 118 as well, stable operations can be obtained by satisfying the condition of Formula (1).

Second Embodiment

In the embodiment, the Gilbert damping constant α of the second ferromagnetic layer 20 is less than 0.4 and greater than 0.01. The damping constant α is $0.01<\alpha<0.4$. Thereby, in the embodiment, the spin-transfer torque caused by the current can be used in combination.

Simulations relating to the damping constant α of the second ferromagnetic layer 20 will now be described.

In the simulations, multiple simulation models having different damping constants α of the second ferromagnetic layer 20 are employed. The configuration of the stacked body SB of the magnetic memory element 111 is used in the models. In the multiple models, the damping constant α is 0.01, 0.02, 0.05, 0.1, 0.15, 0.2, 0.25, 0.3, 0.4, and 0.5, respectively. In the simulations, as recited above, ten models for which the damping constant α is changed are employed. $H_u$ of the second ferromagnetic layer 20 is 1000 Oe for each of the multiple models.

In the simulations, the change of the direction of the magnetization 12 of the second ferromagnetic layer 20 is evaluated when changing $H_{ext}$ and ΔH and when changing from the first set voltage SV1 to the second set voltage SV2 for each of the multiple models. In the simulations, $H_{ext}$ and ΔH are changed with the condition of the inequality of Formula (1) being an equality.

As described above, when the first set voltage SV1 is changed to the second set voltage SV2, the magnetization 12 precesses around an axis that is in a direction that is different from the first direction and the second direction. The simulations evaluate the number of rotations at which the switching of the magnetization 12 occurs after the change from the first set voltage SV1 to the second set voltage SV2. In the simulations, the condition of switching is tolerable up to the third rotation.

FIG. 15A to FIG. 15I are graphs showing characteristics of the nonvolatile memory device according to the second embodiment.

In FIG. 15A to FIG. 15I, the horizontal axis is $H_{ext}$ (Oe); and the vertical axis is ΔH (Oe).

Figure 15A:
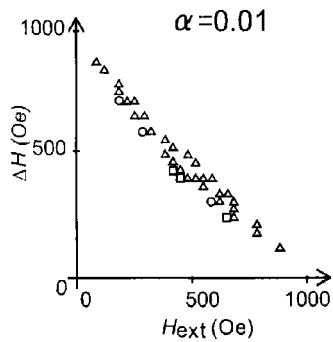
FIG. 15A to FIG. 15I are graphs showing characteristics of a nonvolatile memory device according to a second embodiment.

FIG. 15A shows the simulation results of the model of α=0.01.

Figure 15D:
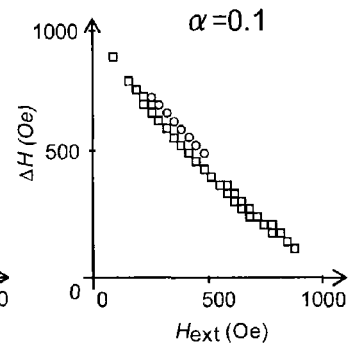
Figure 15G:
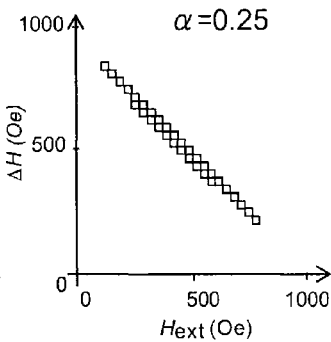
Figure 15B:
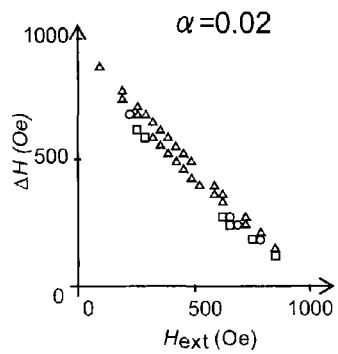

FIG. 15B shows the simulation results of the model of α=0.02

Figure 15E:
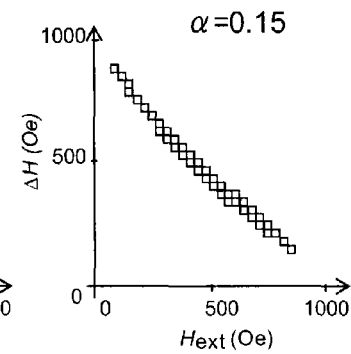
Figure 15H:
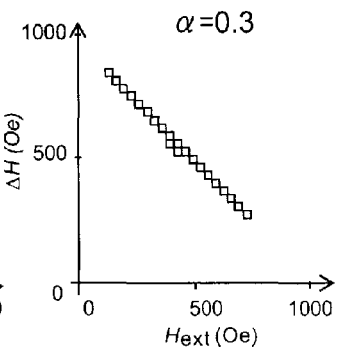
Figure 15C:
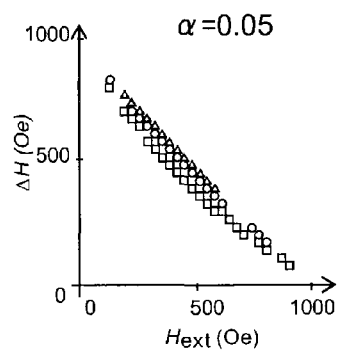

FIG. 15C shows the simulation results of the model of α=0.05.

FIG. 15D shows the simulation results of the model of α=0.1.

FIG. 15E shows the simulation results of the model of α=0.15.

Figure 15F:
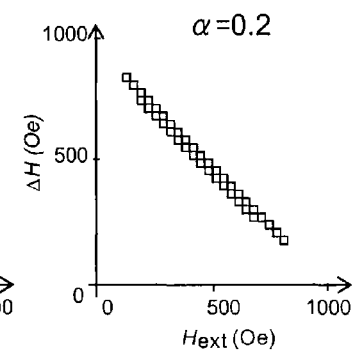

FIG. 15F shows the simulation results of the model of α=0.2.

FIG. 15G shows the simulation results of the model of α=0.25.

FIG. 15H shows the simulation results of the model of α=0.3.

Figure 15I:
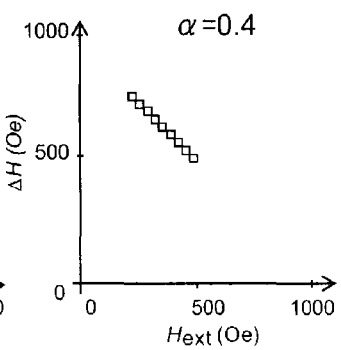

FIG. 15I shows the simulation results of the model of α=0.4.

In FIG. 15A to FIG. 15C, the simulation results of switching in the first rotation are illustrated by the quadrilateral markers; the simulation results of switching in the second rotation are illustrated by the circular markers; and the simulation results of switching in the third rotation are illustrated by the triangular markers.

As shown in FIG. 15A to FIG. 15I, conditions are obtained such that the precession of the magnetization 12 can be stopped in the first rotation in the range of $0.01<\alpha<0.4$. Conversely, the magnetization 12 undesirably rotates two or more rotations in the range where the damping constant α is less than 0.01. Conditions are not obtained such that the precession of the magnetization 12 is stopped in the first rotation in the range where the damping constant α is less than 0.01. For samples in which α=0.5, the precession of the magnetization 12 does not occur. It becomes difficult to change the direction of the magnetization 12 in the range where the damping constant α is greater than 0.5.

Thus, the precession of the magnetization 12 can be stopped appropriately by the damping constant α being $0.01<\alpha<0.4$. In other words, the operations of the nonvolatile memory device 610 can be stabilized further. It is considered that this is because, for example, the movement of the magnetization 12 after changing the direction is suppressed by the spin-transfer torque caused by the current generated in the voltage application.

Third Embodiment

In the embodiment, the voltage torque and the spin-transfer torque are used in combination in the programming.

Figure 16A:
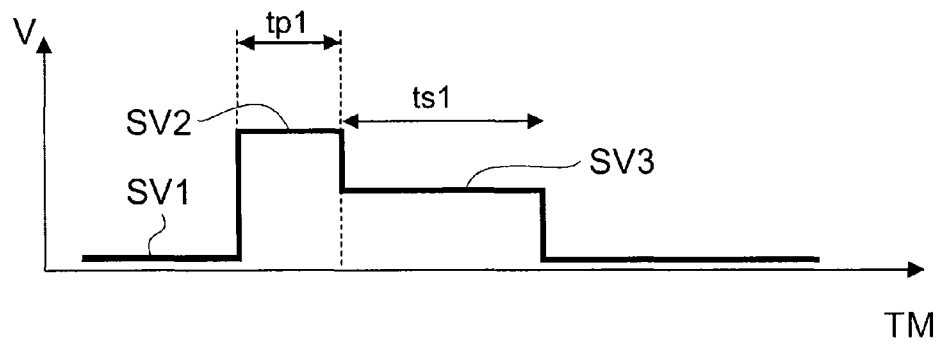
FIG. 16A and FIG. 16B are graphs showing operations of a nonvolatile memory device according to a third embodiment.
Figure 16B:
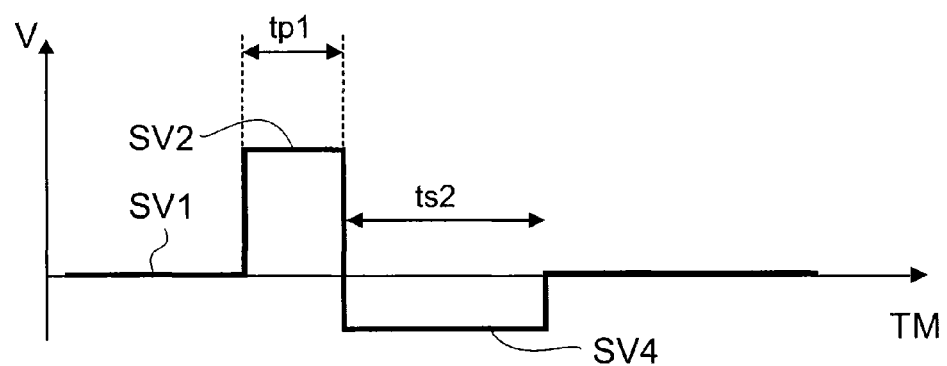

FIG. 16A and FIG. 16B are graphs showing operations of the nonvolatile memory device according to the third embodiment.

In FIG. 16A and FIG. 16B, the horizontal axis is the time TM. In FIG. 16A and FIG. 16B, the vertical axis is the voltage that is applied.

FIG. 16A shows the voltage waveform when changing the magnetization 12 of the second ferromagnetic layer 20 from the parallel state to the antiparallel state.

FIG. 16B shows the voltage waveform when changing the magnetization 12 of the second ferromagnetic layer 20 from the antiparallel state to the parallel state.

In the embodiment as shown in FIG. 16A, in the case of changing the magnetization 12 from the parallel state to the antiparallel state, the control unit 550 changes the voltage between the first ferromagnetic layer 10 and the second ferromagnetic layer 20 from the second set voltage SV2 to a third set voltage SV3 after changing the first set voltage SV1 to the second set voltage SV2. The polarity of the third set voltage SV3 is the same as the polarity of the second set voltage SV2. The absolute value of the third set voltage SV3 is less than the absolute value of the second set voltage SV2. The magnetization 12 precesses during the first duration tp1 of the second set voltage SV2. The control unit 550 performs the change to the third set voltage SV3 after the magnetization 12 is switched to the antiparallel state. For example, the control unit 550 reduces the voltage to reduce the magnetic anisotropy change after the magnetization 12 is switched to the antiparallel state. The spin-transfer torque is used in combination during a duration ts1 of the third set voltage SV3. Therefore, the relaxation of the magnetization 12 is promoted by the damping. The duration ts1 of the third set voltage SV3 is, for example, longer than the first duration tp1 of the second set voltage SV2.

In the change from the second set voltage SV2 to the third set voltage SV3, the trailing time of the second set voltage SV2 may be the second trailing time tf2 which is longer than the relaxation time $\tau_{relax}$. In the second trailing time tf2, the magnetization 12 is relaxed toward a stabilization point because magnetic anisotropy modulation does not occur easily. At this time, during the duration ts1, the relaxation is promoted by the spin-transfer torque being used in combination.

In the embodiment as shown in FIG. 16B, in the case of changing the magnetization 12 from the antiparallel state to the parallel state, the control unit 550 changes the voltage between the first ferromagnetic layer 10 and the second ferromagnetic layer 20 from the second set voltage SV2 to a fourth set voltage SV4 after changing the first set voltage SV1 to the second set voltage SV2. The polarity of the fourth set voltage SV4 is the reverse of the polarity of the second set voltage SV2. The absolute value of the fourth set voltage SV4 is less than the absolute value of the second set voltage SV2.

The magnetization 12 precesses in the first duration tp1. For example, the control unit 550 switches the voltage to a voltage of the reverse polarity when the magnetization 12 is switched to the parallel state. The spin-transfer torque is used in combination during a duration ts2 of the fourth set voltage SV4. Thereby, the relaxation of the magnetization 12 is promoted by the damping.

Thus, by performing the application of the third set voltage SV3 and the application of the fourth set voltage SV4, the operations of the nonvolatile memory device 610 can be stabilized further.

Fourth Embodiment

In the embodiment, the precession of the magnetization 12 occurs for only a half rotation when changing the first set voltage SV1 to the second set voltage SV2.

FIG. 17A to FIG. 17D are graphs showing operations of the nonvolatile memory device according to the fourth embodiment.

Figure 17A:
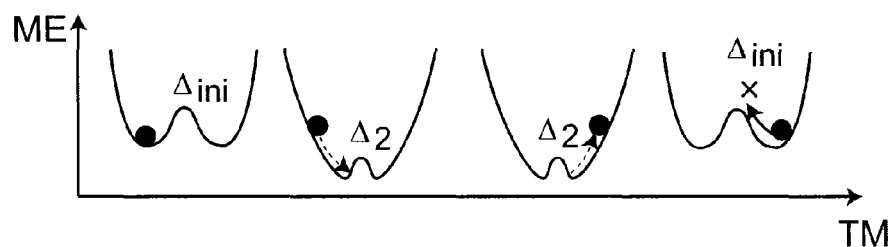
FIG. 17A to FIG. 17D are graphs showing operations of a nonvolatile memory device according to a fourth embodiment.
Figure 17B:
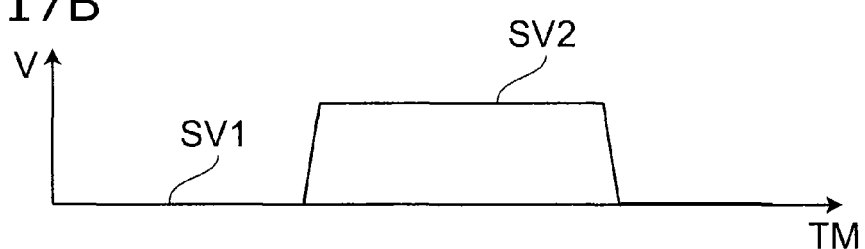
Figure 17C:
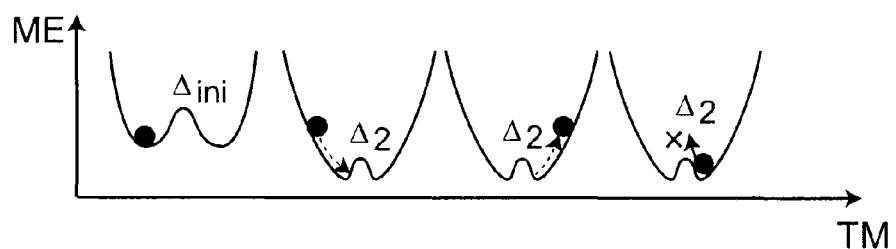
Figure 17D:
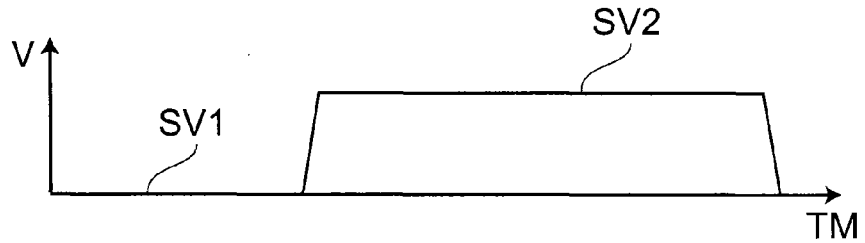

In FIG. 17A to FIG. 17D, the horizontal axis is the time TM. In FIG. 17A and FIG. 17C, the vertical axis is a magnetostatic energy ME (erg/cm$^3$) of the magnetization 12 of the second ferromagnetic layer 20. In FIG. 17B and FIG. 17D, the vertical axis is the voltage that is applied.

The magnetostatic energy of the magnetization 12 of the second ferromagnetic layer 20 in the initial state is defined as $E_{ini}$ (erg/cm$^3$); and the thermal stability factor of the magnetization 12 of the second ferromagnetic layer 20 in the initial state is defined as $\Delta_{ini}$.

As shown in FIG. 17A and FIG. 17B, when the first set voltage SV1 is changed to the second set voltage SV2, the thermal stability factor is changed to $\Delta_2$ by changing the easy axis direction. As a result, the magnetization 12 transitions to a state in which the energy is lower. In the case where the second set voltage SV2 is switched OFF at this time, the thermal stability factor returns to $\Delta_{ini}$. Therefore, the magnetization 12 does not return to the original state. The relationship is considered to be as in Formula (4).

[Formula 4]

$$E_{ini}-E_{dm}>\Delta_{ini}>E_{ini}-E_{rt} \qquad (4)$$

The magnetostatic energy $E_{ini}$, the thermal stability factor $\Delta_{ini}$, the energy $E_{dm}$ (erg/cm$^3$) lost in damping, and the energy $E_{rt}$ (erg/cm$^3$) consumed during the relaxation of the magnetization are used in Formula (4). In particular, the energy $E_{dm}$ lost in damping is the energy lost when the damping acts due to the spin torque.

The second set voltage SV2 satisfies the condition of Formula (4). The control unit 550 applies the second set voltage SV2 to the magnetic memory element 110 to satisfy the condition of Formula (4). Thereby, the precession of the magnetization 12 can be suppressed to a half rotation. In other words, the operations of the nonvolatile memory device 610 can be stabilized further.

FIG. 17C and FIG. 17D show another operation of the embodiment.

As shown in FIG. 17C and FIG. 17D, when the first set voltage SV1 is changed to the second set voltage SV2, the thermal stability factor is changed to $\Delta_2$ by the change of the easy axis direction. As a result, the magnetization 12 transitions to a state in which the energy is lower. In the case where the energy $E_{dm}$ lost in damping is large, the magnetization 12 does not return to the original state because the energy barrier of $\Delta_2$ cannot be exceeded. The relationship is considered to be as in Formula (5).

[Formula 5]

$$E_{ini}-E_{dm}>\Delta_2>E_{ini}-E_{rt} \qquad (5)$$

The second set voltage SV2 satisfies the condition of Formula (5). The control unit 550 applies the second set voltage SV2 to the magnetic memory element 110 to satisfy the condition of Formula (5). Thereby, the precession of the magnetization 12 can be suppressed to a half rotation. In other words, the operations of the nonvolatile memory device 610 can be stabilized further.

Fifth Embodiment

In the embodiment, the second set voltage SV2 is set such that the component $H_u$ in the stacking direction SD1 of the anisotropic magnetic field of the second ferromagnetic layer 20 is substantially the same as the change $\Delta H$ of the component in the stacking direction SD1 of the anisotropic magnetic field of the second ferromagnetic layer 20 when changing the first set voltage SV1 to the second set voltage SV2. Specifically, the control unit 550 applies the second set voltage SV2 to the magnetic memory element 110 (between the first ferromagnetic layer 10 and the second ferromagnetic layer 20) to satisfy the condition of $0.85H_u \le \Delta H \le 1.2H_u$.

In the embodiment, the anisotropic magnetic field of the magnetization 12 in the direction in the stacking direction SD1 can be more appropriately reduced to be smaller than the effective magnetic field of the magnetization 12 in the direction along the in-plane direction SD2. For example, $H_u$ can be canceled by $\Delta H$. Thereby, in the embodiment, the reversal error rate of the magnetization 12 of the second ferromagnetic layer 20 can be reduced. Here, the number of times the voltage between the first ferromagnetic layer 10 and the second ferromagnetic layer 20 is changed from the first set voltage to the second set voltage (the number of switching operations) is taken as STT. The number of times the direction of the magnetization 12 did not change even though the switching operation was implemented (the number of programming errors) is taken as WET. The reversal error rate may be expressed as, for example, WET/STT, which is the ratio of STT and WET. For example, it is supposed that the switching operation of changing the first set voltage to the second set voltage is implemented 10 times, and the direction of the magnetization 12 did not change in one switching operation. In such a case, the reversal error rate is 0.1.

As described above, $\Delta H$ can be determined by, for example, measuring the change of the resonance frequency and/or the change of the magnetoresistance when the first set voltage is changed to the second set voltage.

$H_u$ can be determined from the voltage dependence of the hysteresis response and/or a MagNoise measurement.

It can be discriminated whether or not the second set voltage SV2 satisfies the condition of $0.85H_u \leq \Delta H \leq 1.2H_u$ from, for example, the ratio of $\Delta H$ and $H_u$ determined by the methods recited above.

The simulations relating to the relationship between $\Delta H$ and $H_u$ will now be described.

In the simulations, a model having the configuration of the stacked body SB of the magnetic memory element 111 is employed. In other words, in the simulations, $H_{dx}$=0 Oe; and $H_{dy}$=0 Oe. In the simulations, the second ferromagnetic layer 20 for which $H_u$=1000 Oe is employed. The external magnetic field $H_{ext}$ from the magnetic field application unit MU is 500 Oe. The damping constant α is 0.01. As described above, the simulations are performed by numerical computations using a macro-spin model.

Figure 18A:
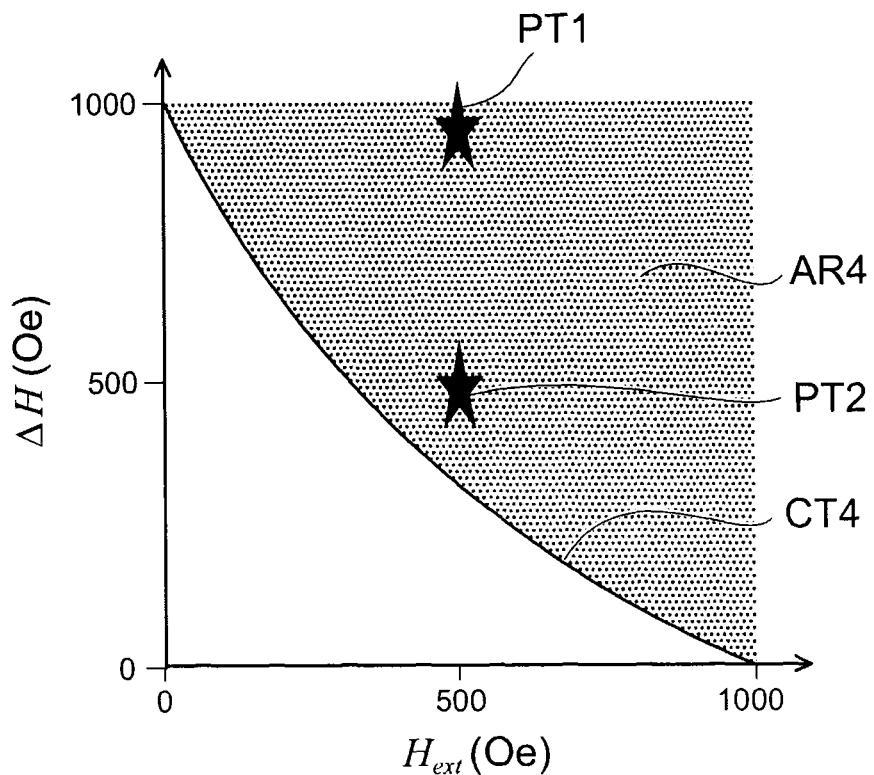
FIG. 18A and FIG. 18B are graphs showing characteristics of a nonvolatile memory device according to a fifth embodiment.
Figure 18B:
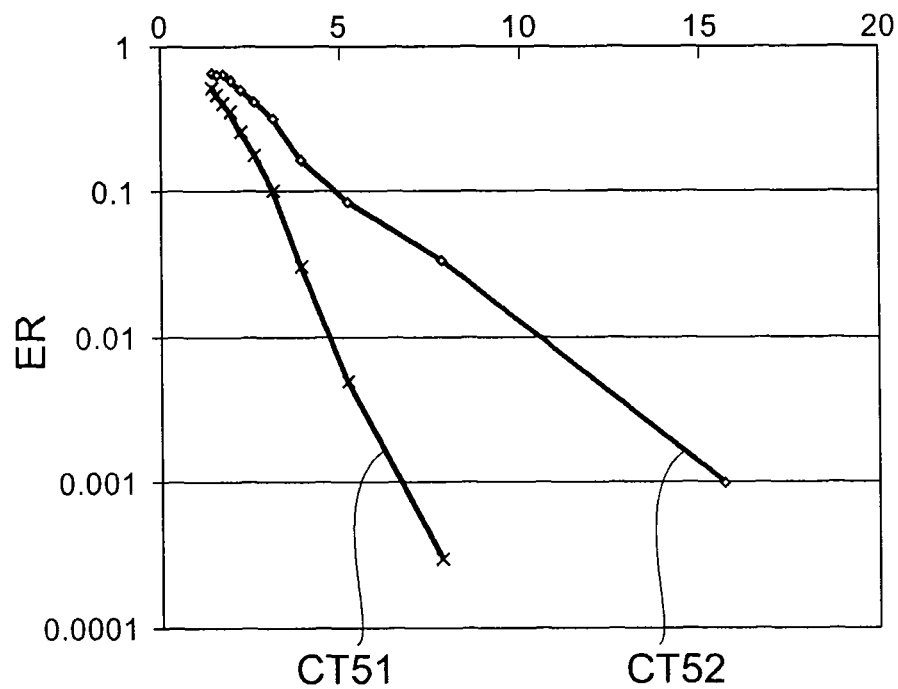

FIG. 18A and FIG. 18B are graphs showing characteristics of the nonvolatile memory device according to the fifth embodiment.

In FIG. 18A, the horizontal axis is $H_{ext}$ (Oe); and the vertical axis is $\Delta H$ (Oe).

In FIG. 18B, the horizontal axis is the Δ value of the second ferromagnetic layer 20; and the vertical axis is a reversal error rate ER. Here, the Δ value is the value of the energy barrier necessary for the magnetization reversal normalized by kBT. In other words, the Δ value is the ratio of the energy barrier necessary for the magnetization reversal of the second ferromagnetic layer 20 and the thermal energy. Here, kB is the Boltzmann constant; and T is the absolute temperature of the magnetic memory element.

FIG. 18A shows a region AR4 where the condition of Formula (1) is satisfied for the magnetic memory element 111 of the conditions recited above. The region AR4 is the cross-hatched portion in FIG. 18A. A characteristic CT4 shown in FIG. 18A corresponds to the right side of Formula (1) for the magnetic memory element 111. The condition of Formula (1) is satisfied for the magnetic memory element 111 when $H_{ext}$ and $\Delta H$ have a relationship inside the region AR4. In the example, the characteristic CT4 is substantially the same as the characteristic CT1 and the characteristic CT2 described above.

In FIG. 18A, point PT1 illustrates a first condition when $\Delta H$=1000 Oe and $\Delta H$=$H_u$. Point PT2 illustrates a second condition when $\Delta H$=500 Oe and $\Delta H$=½$H_u$. In the simulations, the reversal error rate ER is calculated by a macro-spin model at the first and second conditions.

FIG. 18B shows the change of the reversal error rate ER when the Δ value of the second ferromagnetic layer 20 is changed at the first and second conditions. The Δ value of the second ferromagnetic layer 20 is changed by, for example, adjusting the saturation magnetization Ms of the second ferromagnetic layer 20 and/or the volume of the second ferromagnetic layer 20. In the simulations, the first duration tp1 of the second set voltage SV2 applied when changing the orientation of the magnetization 12 of the second ferromagnetic layer 20 is about ½ of the period Cp of the precession of the magnetization 12 at each of the conditions.

FIG. 18B shows a characteristic CT51 that illustrates the simulation results at the first condition and a characteristic CT52 that illustrates the simulation results at the second condition.

As shown in FIG. 18B, the reversal error rate ER decreases exponentially as the Δ value increases. The reversal error rate ER decreases more steeply with respect to the increase of the Δ value for the characteristic CT51 than for the characteristic CT52. The condition that is the reference for data retention for 10 years is, for example, Δ≥60. Therefore, the semi-logarithmic plots of the characteristic CT51 and the characteristic CT52 are extrapolated to Δ=60. In such a case, although the reversal error rate ER at the second condition is about $1\times 10^{-12}$, the reversal error rate ER at the first condition is about $1\times 10^{-25}$ and is much smaller than that of the second condition.

The reason that the reversal error rate ER is smaller in the case of the first condition is as follows.

At the first condition, the component in the stacking direction SD1 of the anisotropic magnetic field of the magnetization 12 of the second ferromagnetic layer 20 is substantially zero; and only the external magnetic field $H_{ext}$ acts on the second ferromagnetic layer 20. The anisotropic magnetic field of the second ferromagnetic layer 20 depends on the orientation of the magnetization 12. For example, in the case where the magnetization 12 is perpendicular to the film surface, the absolute value of the anisotropic magnetic field Hu has a maximum. Then, the case where the magnetization 12 is oriented in the in-plane direction, the absolute value of the anisotropic magnetic field $H_u$ is zero. On the other hand, the external magnetic field $H_{ext}$ does not depend on the orientation of the magnetization 12. At a condition such as the first condition at which the anisotropic magnetic field $H_u$ is substantially zero and only the external magnetic field $H_{ext}$ acts on the second ferromagnetic layer 20, the magnetization 12 of the second ferromagnetic layer 20 precesses at the same period Cp regardless of the initial angle (the tilt angle from the stacking direction SD1). Conversely, at a condition such as the second condition at which the anisotropic magnetic field $H_u$ remains, the period Cp of the precession of the magnetization 12 differs by initial angle; and the reversal error rate ER increases.

Simulation results to examine how much the reversal error rate ER increases in the case where the anisotropic magnetic field $H_u$ slightly remains when the first set voltage SV1 is changed to the second set voltage SV2 will now be described.

Figure 19:
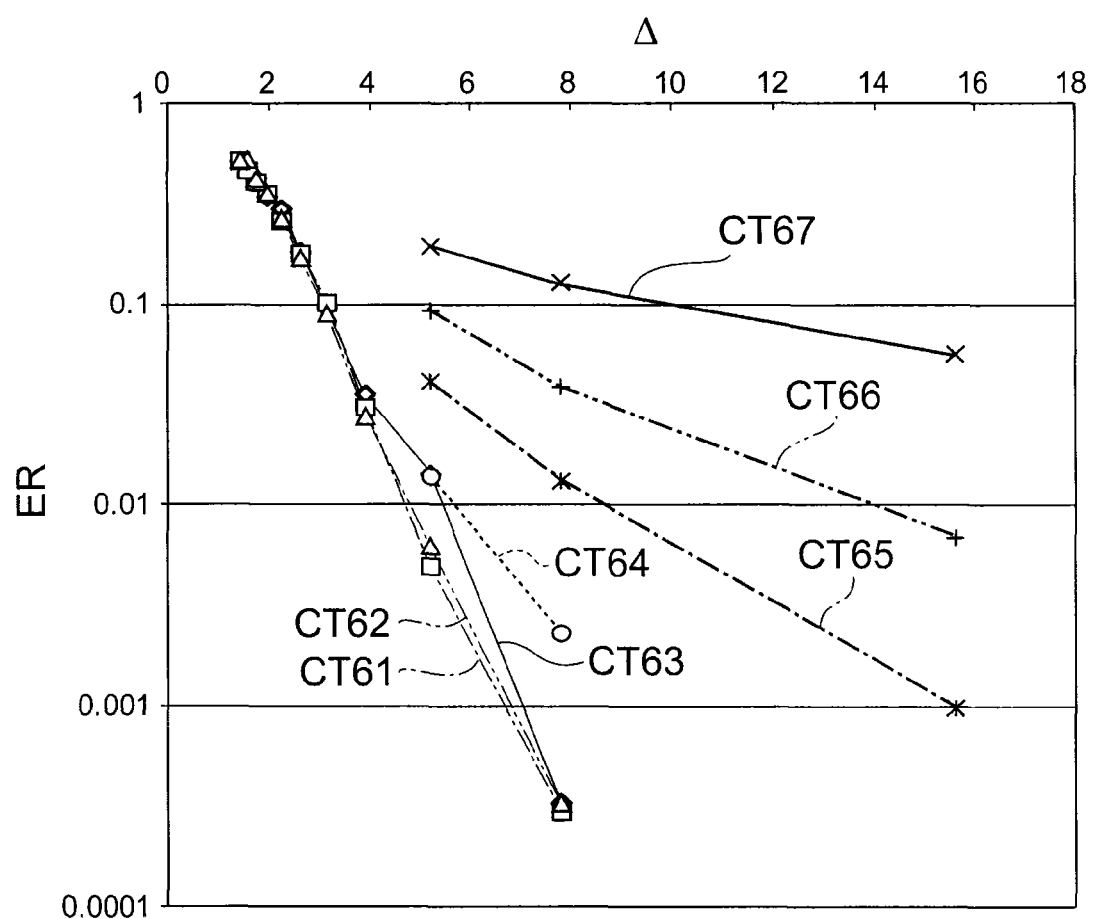
FIG. 19 is a graph showing characteristics of the nonvolatile memory device according to the fifth embodiment.

FIG. 19 is a graph showing characteristics of the nonvolatile memory device according to the fifth embodiment.

In FIG. 19, the horizontal axis is the Δ value; and the vertical axis is the reversal error rate ER.

FIG. 19 shows the results of calculating the reversal error rate ER when the change $\Delta H$ of the component in the stacking direction SD1 of the anisotropic magnetic field of the second ferromagnetic layer 20 when changing the first set voltage SV1 to the second set voltage SV2 is changed from the condition of being 30% smaller than $H_u$ to the condition of being 30% larger than $H_u$. For example, +10% is the calculation result of the condition of $\Delta H = H_u \times 1.1$.

FIG. 19 shows a characteristic CT61 when $\Delta H = H_u$, a characteristic CT62 when $\Delta H$ is 10% larger than $H_u$, a characteristic CT63 when $\Delta H$ is 10% smaller than $H_u$, a characteristic CT64 when $\Delta H$ is 20% larger than $H_u$, a characteristic CT65 when $\Delta H$ is 20% smaller than $H_u$, a characteristic CT66 when $\Delta H$ is 30% larger than $H_u$, and a characteristic CT67 when $\Delta H$ is 30% smaller than $H_u$.

As shown in FIG. 19, the reversal error rate ER substantially does not change in the range where the shift amount of $\Delta H$ is ±10%. On the other hand, the reversal error rate ER increases as the absolute value of the shift amount of $\Delta H$ increases when the shift amount of $\Delta H$ becomes larger than ±10%.

Here, the characteristic CT61 of FIG. 19 is substantially the same as the characteristic CT51 of FIG. 18B. In other words, the characteristic CT52 of FIG. 18B is the characteristic when $\Delta H$ is 50% smaller than $H_u$. In the simulations shown in FIG. 18B, the duration of the second set voltage SV2 is adjusted such that the direction of the magnetization 12 changes 180° for both the characteristic CT51 and the characteristic CT52. Conversely, in the simulations shown in FIG. 19, the duration of the second set voltage SV2 is adjusted such that the direction of the magnetization 12 changes 180° for the characteristic CT61; and the characteristic CT62 to the characteristic CT67 are calculated using the same duration as the characteristic CT61. Thus, the conditions of the simulations shown in FIG. 19 are different from the conditions of the simulations shown in FIG. 18B. Therefore, the reversal error rate ER is larger for the characteristic CT67 than for the characteristic CT52.

Figure 20:
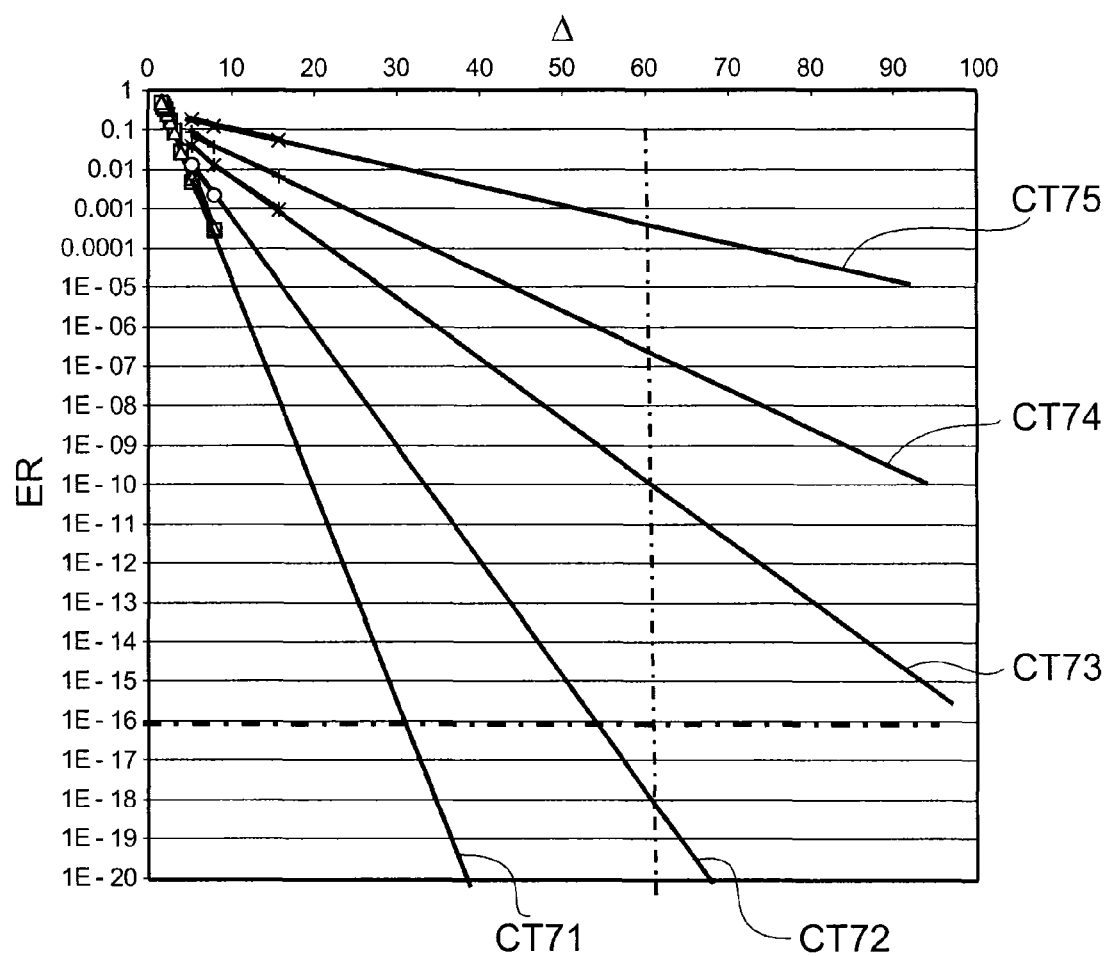
FIG. 20 is a graph showing characteristics of the nonvolatile memory device according to the fifth embodiment.

FIG. 20 is a graph showing characteristics of the nonvolatile memory device according to the fifth embodiment.

In FIG. 20, the horizontal axis is the $\Delta$ value; and the vertical axis is the reversal error rate ER.

FIG. 20 is a graph in which the simulation results of FIG. 19 are extrapolated.

FIG. 20 shows a characteristic CT71 to a characteristic CT75. The characteristic CT71 is the result of the extrapolation of the characteristic CT61. The results of the extrapolations of the characteristic CT62 and the characteristic CT63 are substantially the same as that of the characteristic CT71 and therefore are not shown. The characteristic CT72 is the result of the extrapolation of the characteristic CT64. The characteristic CT73 is the result of the extrapolation of the characteristic CT65. The characteristic CT74 is the result of the extrapolation of the characteristic CT66. The characteristic CT75 is the result of the extrapolation of the characteristic CT67. From the graph, the reversal error rate ER for the setting of $\Delta=60$ can be estimated.

Figure 21:
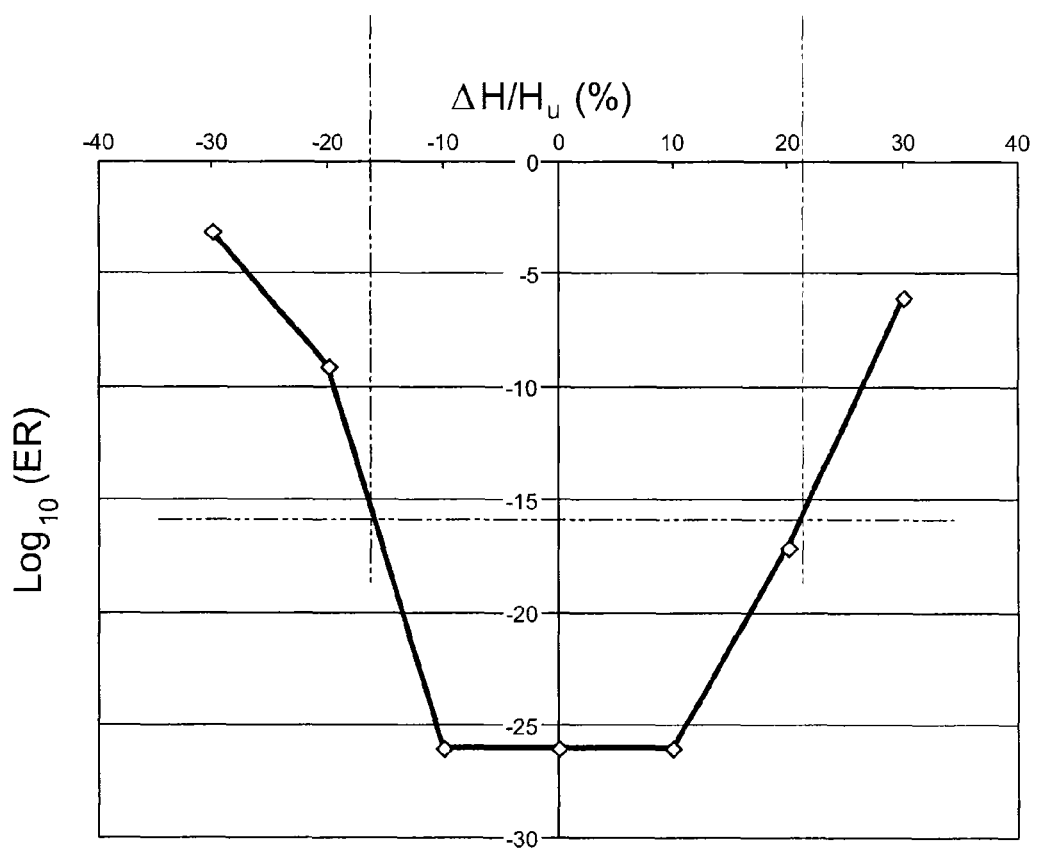
FIG. 21 is a graph showing characteristics of the nonvolatile memory device according to the fifth embodiment.

FIG. 21 is a graph showing characteristics of the nonvolatile memory device according to the fifth embodiment.

In FIG. 21, the horizontal axis is $\Delta H/H_u$ (%) which is the ratio of $\Delta H$ and $H_u$; and the vertical axis is the $\log_{10}(ER)$ which is a logarithmic plot the reversal error rate ER.

FIG. 21 is a graph in which the reversal error rate ER when $\Delta=60$ is plotted for each of the characteristic CT71 to the characteristic CT75.

As shown in FIG. 21, in the case where the tolerable value of the reversal error rate ER of a general-purpose memory of $1\times10^{-16}$ is set to be the threshold, the range of $\Delta H$ to realize the condition of $\Delta=60$ is from 85% of $H_u$ to 120% of $H_u$. Accordingly, the reversal error rate ER of the magnetization 12 of the second ferromagnetic layer 20 can be reduced by the control unit 550 applying the second set voltage SV2 to the magnetic memory element 110 to satisfy the condition of $0.85H_u \leq \Delta H \leq 1.2H_u$.

Sixth Embodiment

In the embodiment, multiple magnetic memory elements are disposed in a matrix configuration.

Figure 22:
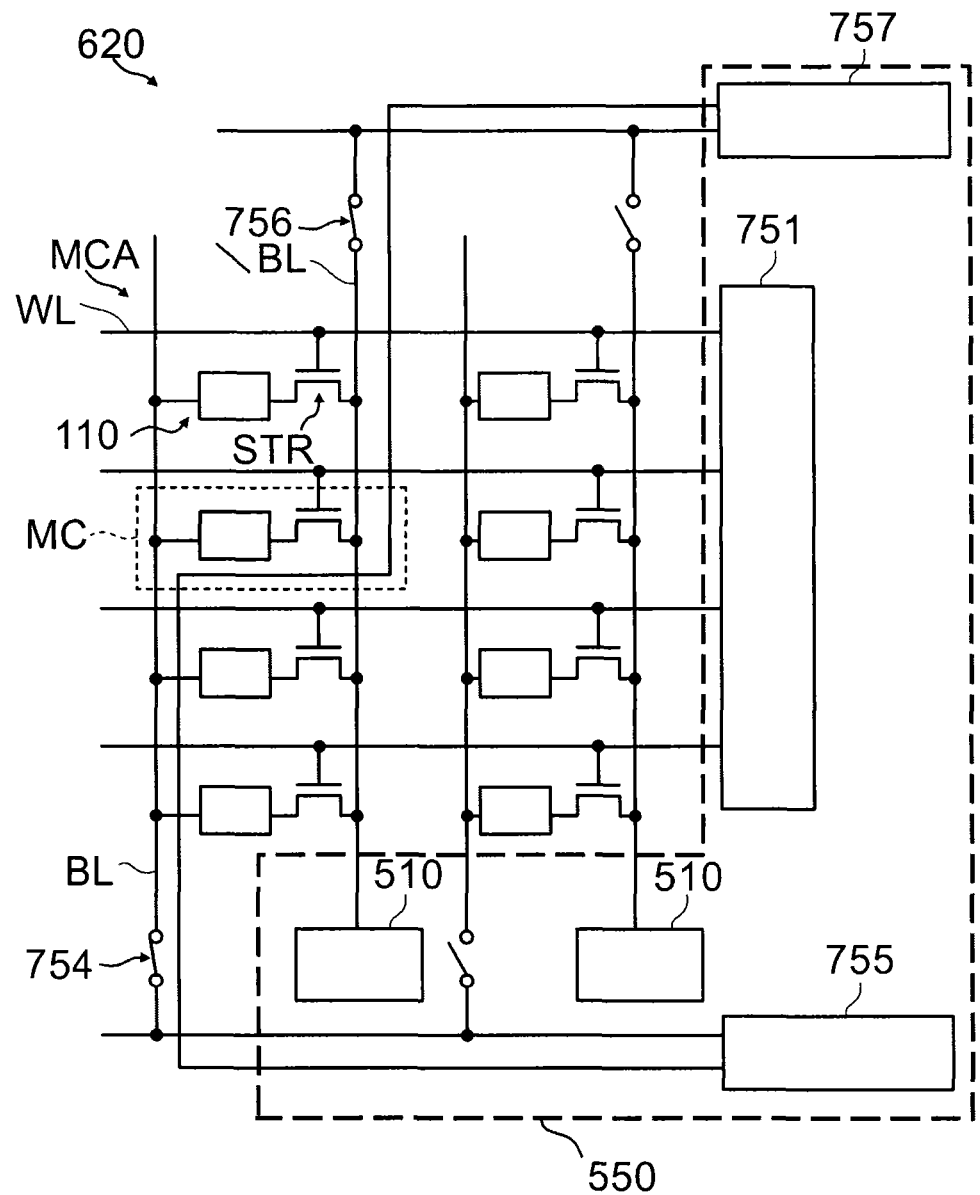
FIG. 22 is a schematic view showing a configuration of a nonvolatile memory device according to a sixth embodiment.

FIG. 22 is a schematic view showing the configuration of the nonvolatile memory device according to the sixth embodiment.

As shown in FIG. 22, the nonvolatile memory device 620 according to the embodiment includes a memory cell array unit MCA. The memory cell array unit MCA includes multiple memory cells MC arranged in a matrix configuration.

Each of the memory cells MC includes one selected from the magnetic memory elements according to the first embodiment. In the example, the magnetic memory element 110 is used.

Multiple bit interconnect pairs (a bit interconnect BL and a bit interconnect bar-BL) and multiple word interconnects WL are disposed in the memory cell array unit MCA. Each of the multiple bit interconnect pairs extends in the column direction. Each of the multiple word interconnects WL extends in the row direction.

The memory cells MC are disposed at the intersections between the bit interconnects BL and the word interconnects WL. Each of the memory cells MC includes a magnetic memory element (e.g., the magnetic memory element 110) and a selection transistor STR. One end of the magnetic memory element 110 is connected to the bit interconnect BL. The other end of the magnetic memory element 110 is connected to the drain terminal of the selection transistor STR. The gate terminal of the selection transistor STR is connected to the word interconnect WL. The source terminal of the selection transistor STR is connected to the bit interconnect bar-BL.

A row decoder 751 is connected to the word interconnects WL. One end of one of the bit interconnect pair (e.g., the bit interconnect bar-BL) is connected to a read-out unit 510. The other end of the one of the bit interconnect pair (e.g., the bit interconnect bar-BL) is connected to a first power supply source/sink circuit 757 via a switch 756. The other of the bit interconnect pair (e.g., the bit interconnect BL) is connected to a second power supply source/sink circuit 755 via a switch 754.

For example, the control unit 550 includes the read-out unit 510, the row decoder 751, the first power supply source/sink circuit 757, and the second power supply source/sink circuit 755. The control unit 550 is electrically connected to each of the multiple magnetic memory elements 110 via the bit interconnects BL, the word interconnects WL, the selection transistors STR, etc. The control unit 550 implements the programming of the data and the reading of the data for each of the multiple magnetic memory elements 110.

By such a configuration, the data can be programmed to any memory cell MC (e.g., any magnetic memory element 110) of the memory cell array unit MCA; and the data programmed to the magnetic memory element 110 can be read. In a nonvolatile memory device 620 thus configured, stable operations can be obtained by satisfying the condition of Formula (1).

According to the embodiments, a nonvolatile memory device having stable operations is provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nonvolatile memory devices such as memory units, magnetic memory elements, control units, stacked bodies, magnetic field application units, first to fourth ferromagnetic layers, first to third nonmagnetic layers, etc., from known art; and such practice is included in the scope of the invention to the extent that similar effects are obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device, comprising:
a memory unit including
a magnetic memory element including a stacked body, the stacked body including
a first ferromagnetic layer having a fixed direction of magnetization;
a second ferromagnetic layer having a changeable direction of magnetization; and
a first nonmagnetic layer provided between the first ferromagnetic layer and the second ferromagnetic layer,
the first ferromagnetic layer, the second ferromagnetic layer, and the first nonmagnetic layer being stacked in a stacking direction, and
a magnetic field application unit configured to apply a magnetic field to the second ferromagnetic layer, the magnetic field having a component in a first in-plane direction perpendicular to the stacking direction; and
a control unit electrically connected to the magnetic memory element,
the control unit being configured to implement a setting operation of changing a voltage between the first ferromagnetic layer and the second ferromagnetic layer of the magnetic memory element from a first set voltage to a second set voltage,
the magnetic field applied by the magnetic field application unit satisfying the condition of $$\Delta H > (H_u + H_{dx}) \frac{(H_u + H_{dx} - H_{ext})}{(H_u + H_{dx} + H_{ext})} \quad \text{[Formula 1]}$$

where
a change of a stacking-direction component of an anisotropic magnetic field of the second ferromagnetic layer when changing from the first set voltage to the second set voltage is $\Delta H$ (oersteds),
the stacking-direction component of the anisotropic magnetic field of the second ferromagnetic layer at the first set voltage is $H_u$ (oersteds),
the first in-plane-direction component of the magnetic field applied by the magnetic field application unit is $H_{ext}$ (oersteds), and
a component in the first in-plane direction of the anisotropic magnetic field of the second ferromagnetic layer at the first set voltage is $H_{dx}$ (oersteds).

2. The device according to claim 1, wherein
a stacking-direction component of the magnetization of the first ferromagnetic layer is larger than a component of the magnetization of the first ferromagnetic layer projected onto a plane perpendicular to the stacking direction,
the second ferromagnetic layer is changeable in at least a first direction and a second direction,
a component in the stacking direction is larger than a component projected onto the plane for the magnetization of the second ferromagnetic layer oriented in the first direction,
a component in the stacking direction is larger than a component projected onto the plane for the magnetization of the second ferromagnetic layer oriented in the second direction, and
an orientation of the stacking-direction component of the magnetization of the second ferromagnetic layer oriented in the second direction is the reverse of an orientation of the stacking-direction component of the magnetization of the second ferromagnetic layer oriented in the first direction.

3. The device according to claim 2, wherein the control unit changes the direction of the magnetization of the second ferromagnetic layer from the first direction to the second direction or from the second direction to the first direction by the changing from the first set voltage to the second set voltage.

4. The device according to claim 2, wherein a length of the second ferromagnetic layer in the first in-plane direction is shorter than a length of the second ferromagnetic layer in a second in-plane direction perpendicular to the stacking direction and the first in-plane direction.

5. The device according to claim 2, wherein a damping constant α of the second ferromagnetic layer is less than 0.4 and greater than 0.01.

6. The device according to claim 3, wherein
the control unit, in the setting operation, further changes the voltage between the first ferromagnetic layer and the second ferromagnetic layer from the second set voltage to a third set voltage after the changing from the first set voltage to the second set voltage when an orientation of a stacking-direction component of the magnetization of the second ferromagnetic layer is the same as an orientation of a stacking-direction component of the magnetization of the first ferromagnetic layer;
the control unit, in the setting operation, further changes the voltage between the first ferromagnetic layer and the second ferromagnetic layer from the second set voltage to a fourth set voltage after the changing from the first set voltage to the second set voltage when the orientation of the stacking-direction component of the magnetization of the second ferromagnetic layer is the reverse of the orientation of the stacking-direction component of the magnetization of the first ferromagnetic layer;
the polarity of the third set voltage is the same as the polarity of the second set voltage;
the absolute value of the third set voltage is less than the absolute value of the second set voltage;
the polarity of the fourth set voltage is the reverse of the polarity of the second set voltage; and
the absolute value of the fourth set voltage is less than the absolute value of the second set voltage.

7. The device according to claim 2, wherein
the magnetic field application unit includes a third ferromagnetic layer stacked with the stacked body in the stacking direction, the third ferromagnetic layer having a fixed direction of magnetization, and
a component in the first in-plane-direction is larger than a component in the stacking direction for the magnetization of the third ferromagnetic layer.

8. The device according to claim 7, wherein the magnetic field application unit further includes a second nonmagnetic layer provided between the third ferromagnetic layer and the stacked body.

9. The device according to claim 7, wherein the third ferromagnetic layer contacts the second ferromagnetic layer.

10. The device according to claim 7, wherein the third ferromagnetic layer contacts the first ferromagnetic layer.

11. The device according to claim 1, wherein the stacked body further includes:
a fourth ferromagnetic layer stacked in the stacking direction on the second ferromagnetic layer side, the fourth ferromagnetic layer having a changeable direction of magnetization; and a third nonmagnetic layer provided between the second ferromagnetic layer and the fourth ferromagnetic layer.

12. The device according to claim 1, wherein
the control unit further implements a first read-out operation of changing the voltage between the first ferromagnetic layer and the second ferromagnetic layer from a first reference voltage to a first read-out voltage, and
the polarity of the first read-out voltage is the reverse of the polarity of the second set voltage.

13. The device according to claim 1, wherein the control unit, in the setting operation, causes a time of the change between the first set voltage and the second set voltage to be shorter than a relaxation time of a change of the direction of the magnetization of the second ferromagnetic layer.

14. The device according to claim 13, wherein the control unit causes a time of changing from the second set voltage to the first set voltage to be longer than the relaxation time.

15. The device according to claim 13, wherein
the control unit further implements a second read-out operation of changing the voltage between the first ferromagnetic layer and the second ferromagnetic layer from a second reference voltage to a second read-out voltage,
a time of changing from the second reference voltage to the second read-out voltage is longer than a time of changing from the first set voltage to the second set voltage, and
the time of changing from the second reference voltage to the second read-out voltage is longer than the relaxation time.

16. The device according to claim 15, wherein the control unit causes a time of changing from the second read-out voltage to the second reference voltage to be longer than the relaxation time.

17. The device according to claim 1, wherein the second set voltage satisfies the condition of $$E_{ini}-E_{dm}>\Delta_{ini}>E_{ini}-E_{rt}$$

where
a magnetostatic energy of the magnetization of the second ferromagnetic layer in an initial state is $E_{ini}$ (erg/cm$^3$),
energy lost in damping is $E_{dm}$ (erg/cm$^3$),
a thermal stability factor of the magnetization of the second ferromagnetic layer in the initial state is $\Delta_{ini}$, and
energy consumed as the magnetization is relaxed is $E_{rt}$ (erg/cm$^3$).

18. The device according to claim 1, wherein the second set voltage satisfies the condition of $$E_{ini}-E_{dm}>\Delta_2>E_{ini}-E_{rt}$$

where
a magnetostatic energy of the magnetization of the second ferromagnetic layer in an initial state is $E_{ini}$ (erg/cm$^3$),
energy lost in damping is $E_{dm}$ (erg/cm$^3$),
a thermal stability factor of the magnetization of the second ferromagnetic layer when the second set voltage is applied is $\Delta_2$, and
energy consumed as the magnetization is relaxed is $E_{rt}$ (erg/cm$^3$).

19. The device according to claim 2, wherein the second set voltage applied to the magnetic memory element by the control unit satisfies the condition of $0.85H_u \leq \Delta H \leq 1.2H_u$.

20. The device according to claim 1, wherein
a plurality of the magnetic memory elements is provided, and
the control unit is electrically connected to each of the plurality of magnetic memory elements.

* * * * *